(12) United States Patent
Nakashima et al.

(10) Patent No.: US 6,634,370 B2
(45) Date of Patent: Oct. 21, 2003

(54) LIQUID TREATMENT SYSTEM AND LIQUID TREATMENT METHOD

(75) Inventors: Satoshi Nakashima, Kikuchi-gun (JP); Wataru Okase, Tsukui-gun (JP); Takenobu Matsuo, Tsukui-gun (JP); Tameyasu Hyakuzuka, Tsukui-gun (JP); Yasushi Yagi, Tsukui-gun (JP); Yoshiyuki Harima, Tsukui-gun (JP); Jun Yamauchi, Tsukui-gun (JP); Hiroki Taniyama, Tosu (JP); Kyungho Park, Kawasaki (JP); Yoshitsugu Tanaka, Nirasaki (JP); Yoshinori Kato, Kuwana (JP); Hiroshi Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 19 days.

(21) Appl. No.: 09/849,276

(22) Filed: May 7, 2001

(65) Prior Publication Data
US 2001/0037764 A1 Nov. 8, 2001

(30) Foreign Application Priority Data

May 8, 2000 (JP) .................................. P2000-174438
May 8, 2000 (JP) .................................. P2000-174442

(51) Int. Cl.[7] ............................. B08B 3/00; B05C 13/00

(52) U.S. Cl. .................... 134/61; 134/102.1; 134/200; 118/70; 118/500

(58) Field of Search .............................. 134/2, 61, 76, 134/90, 92, 102.1, 105, 157, 200, 902; 118/70, 500; 438/906

(56) References Cited

U.S. PATENT DOCUMENTS

| 5,568,821 A | * | 10/1996 | Ohmori et al. ............... 134/61 |
| 5,664,254 A | * | 9/1997 | Ohkura et al. .............. 396/612 |
| 5,849,104 A | * | 12/1998 | Mohindra et al. ......... 134/25.4 |
| 6,115,867 A | * | 9/2000 | Nakashima et al. ........... 15/77 |
| 6,294,059 B1 | * | 9/2001 | Hongo et al. ............... 204/198 |

* cited by examiner

Primary Examiner—Randy Gulakowski
Assistant Examiner—Joseph Perrin
(74) Attorney, Agent, or Firm—Pillsbury Winthrop LLP

(57) ABSTRACT

Liquid treatment units are disposed in multi-tiers surrounding a main-arm 35. Among liquid treatment units, plating units M1 through M4 are disposed on a lower tier side, and a unit for post-treatment process such as a cleaning unit 70 where a cleaner atmosphere is necessary is disposed on an upper tier side. Thereby, an improvement in an area efficiency and the formation and maintenance of a clean atmosphere can be simultaneously obtained.

11 Claims, 21 Drawing Sheets

FLOW OF SYSTEM ENTIRETY

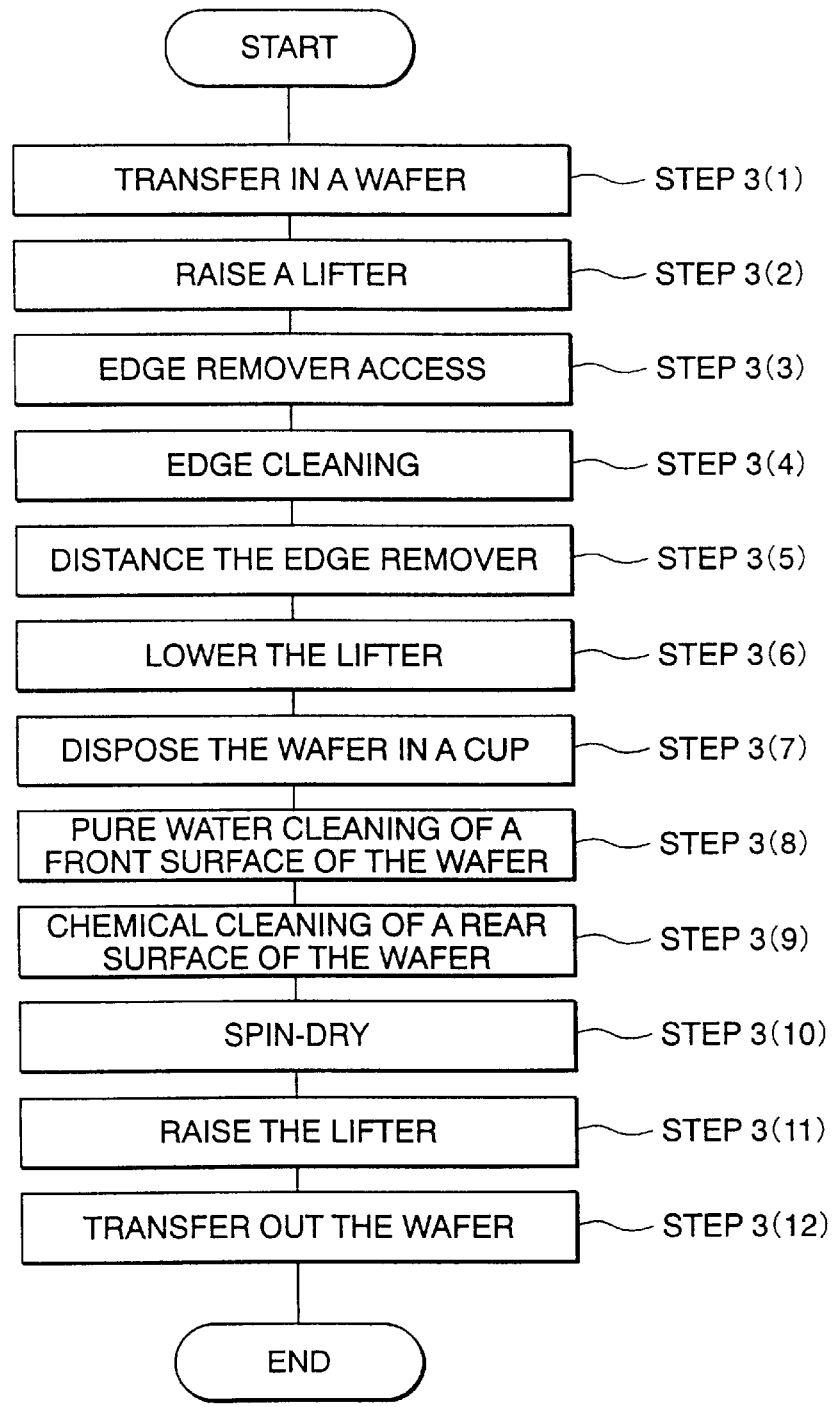

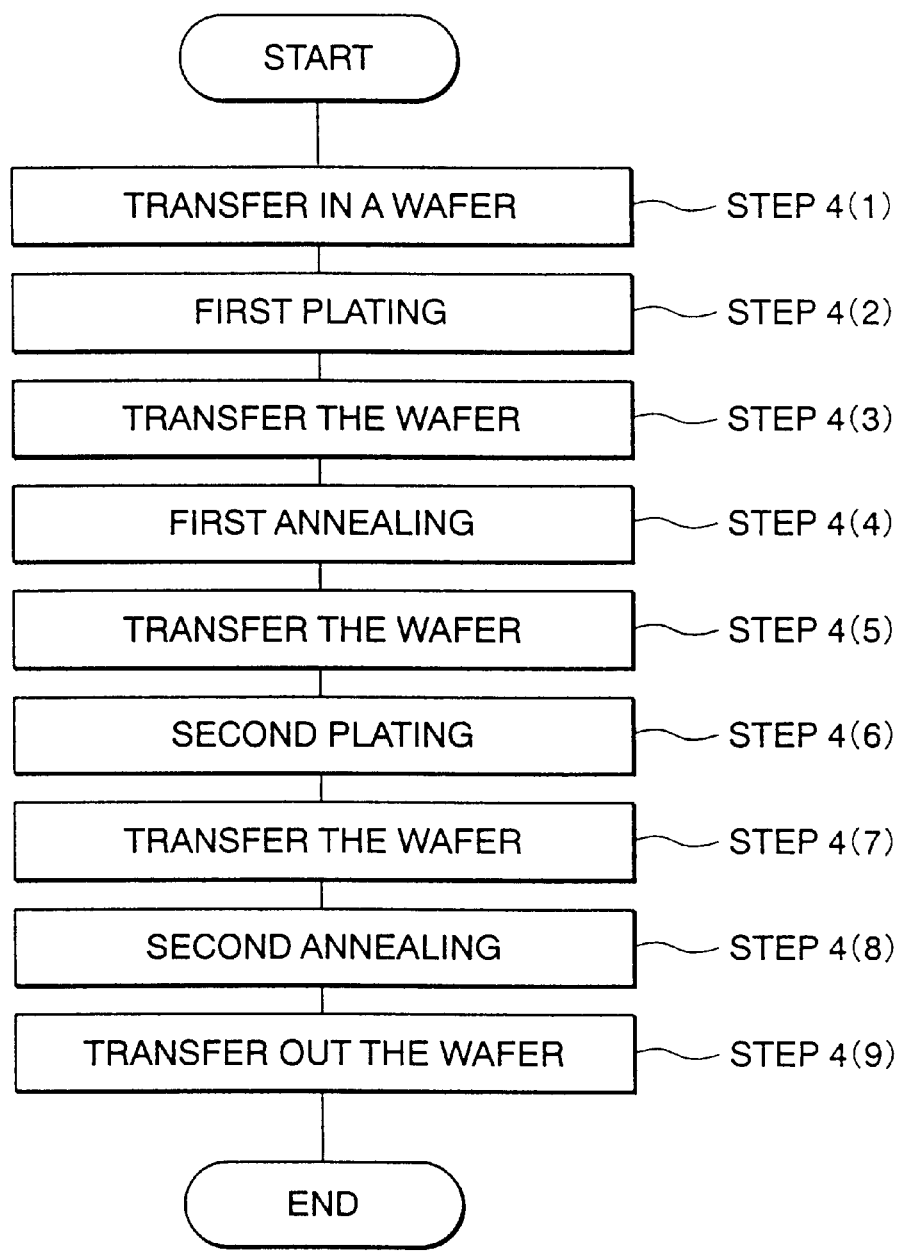

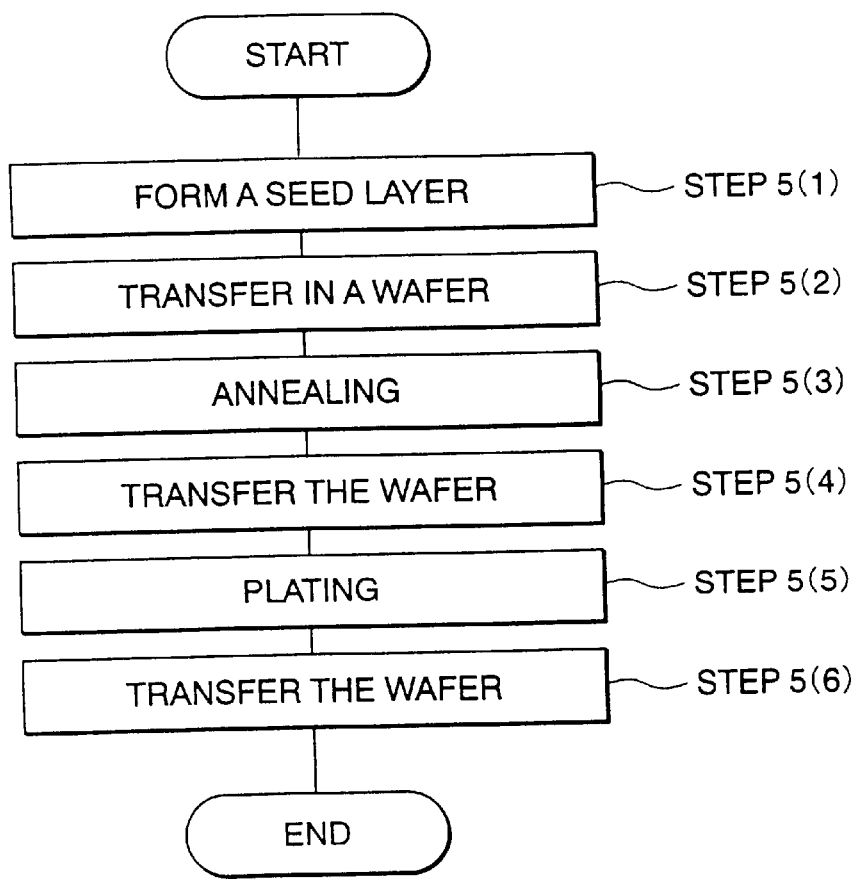

LIQUID TREATMENT SYSTEM AND LIQUID TREATMENT METHOD

BACKGROUND OF THE INVENTION

1. Field of the Invention

The present invention relates to liquid treatment of a substrate such as a semiconductor wafer or the like, in particular to a liquid treatment system using a plurality of liquid treatment units and a liquid treatment method therefor.

2. Description of the Related Art

When forming a metal layer on a surface of a substrate such as a semiconductor wafer or the like, a liquid treatment method such as a plating method or the like is employed.

When forming a metal layer by means of a plating method, a bath accommodating a plating solution is necessary.

With the increase of structural complexity in semiconductor elements, semiconductor wafers have frequently been plated with a plurality of plating solutions of different compositions, resulting in an increase in the number of plating solution baths being used.

Furthermore, in order to treat a large number of semiconductor wafers at a time to reduce manufacturing cost, the number of plating solution baths being disposed in a treatment chamber increases.

However, when many plating solution baths are employed the area occupied by the equipment increases and the utility and efficiency of the site decreases.

Furthermore, mist containing the plating solution diffuses from the plating solution bath to contaminate the inside of the treatment chamber, thereby possibly deteriorating the quality of the metal layer.

Still furthermore, when plating solution baths of different compositions are adjacently disposed, one plating solution is likely to enter from one bath into another one.

SUMMARY OF THE INVENTION

An aspect of the present invention is to provide a liquid treatment system that uses a lot of area efficiently.

Another aspect of the present invention is to provide a liquid treatment system capable of separately controlling an atmosphere of the liquid treatment system or each liquid treatment unit, and a liquid treatment method therefor.

Still another aspect of the present invention is to provide a liquid treatment system capable of densely disposing liquid treatment units that use different kinds of treatment solutions.

(1) In an embodiment of the present invention, the liquid treatment system involving comprises a first liquid treatment unit constructed and arranged to implement a first liquid treatment with a first treatment solution containing a metal ion on a substrate, a second liquid treatment unit constructed and arranged to implement a second liquid treatment on the substrate thereon, after the first liquid treatment is implemented, and a first transfer unit constructed and arranged to transfer the substrate in a vertical direction, wherein the first and second liquid treatment units are disposed in multi-tiers in a vertical direction around the first transfer unit.

Due to the multi-tier disposition of the first and second liquid treatment units, an occupation area of the liquid treatment system can be rendered smaller.

In one embodiment, the first liquid treatment unit may implement the first liquid treatment on a first surface of the substrate and the second liquid treatment unit may implement the second liquid treatment on a second surface of the substrate. In addition to the above, the first transfer unit may have a mechanism constructed and arranged to turn upside down surfaces of the substrate.

The first and second liquid treatment units can treat both surfaces of the substrate simultaneously. Accordingly, treatment efficiency can be improved. Furthermore, when the first transfer unit has a mechanism for turning upside down the substrate, it is not necessary to dispose the reversal mechanism separately. Furthermore, the reversal of the substrate is facilitated during the transfer when the first transfer unit has the mechanism for turning upside down the substrate.

In another embodiment, the liquid treatment system may further comprise a first gas feed constructed and arranged to feed a cleansed gas in the liquid treatment system, The second liquid treatment unit may be disposed on an upstream side of the flow of cleansed gas relative to the first liquid treatment unit.

Accordingly, an atmosphere on the second liquid treatment side can be maintained clean.

The liquid treatment system may further comprise a second transfer unit constructed and arranged to transfer the substrate out of the second liquid treatment unit.

The substrate treated by the second liquid treatment unit is transferred outside the second liquid treatment unit with the use of the second transfer unit. Accordingly, the first transfer unit is prevented from touching the substrate treated by the second liquid treatment unit.

The second liquid treatment unit may be disposed above the first liquid treatment unit.

For instance, a cleaning unit as the second liquid treatment unit is disposed above a plating unit as the first liquid treatment unit. As a result, the second liquid treatment unit is prevented from being contaminated by an atmosphere of the first liquid treatment unit.

The liquid treatment system may further comprise a heating unit for heating the substrate after the first liquid treatment is applied.

For example, with the use of the heating unit, heating such as annealing for reforming a copper plating layer formed on the substrate can be implemented.

The liquid treatment system may further comprise a temperature controller constructed and arranged to control a temperature in the liquid treatment system.

By suppressing a temperature rise in the liquid treatment system, mist that may be generated from the treatment solution can be reduced.

The first and second liquid treatment units are units independent from each other and detachable from the liquid treatment system.

Since the first and second liquid treatment units are detachable from the liquid treatment system, maintenance is facilitated and maintenance efficiency can be improved. Furthermore, since the first and second liquid treatment units are independent from each other each can be easily replaced when needed.

The first liquid treatment unit may have a housing capable of maintaining an interior atmosphere thereof substantially airtight.

Thereby, the mist of the treatment solution is prevented from flowing out of the first liquid treatment unit to contaminate an exterior atmosphere of the first liquid treatment unit.

The first liquid treatment unit may further comprise a second gas feed constructed and arranged to feed a cleansed gas in the housing.

By the use of the second gas feed, a clean atmosphere can be maintained in an interior of the first liquid treatment unit.

The first liquid treatment unit may further comprise an exhaust arranged to make a pressure of the housing interior lower than that of the housing exterior.

When sending the substrate in and out of the housing, contaminated air can be prevented from flowing outside the liquid treatment unit.

The first liquid treatment unit may further comprise a temperature control means for controlling a temperature in the housing.

By suppressing a temperature rise in the liquid treatment unit, the generation of mist from the treatment solution can be reduced.

The interior of the housing may be partitioned in two portions. A first treatment portion including a transfer position for transferring in and out the substrate, and a second treatment portion including a liquid treatment position for implementing the first liquid treatment on the substrate.

The first liquid treatment that is likely to generate the mist of the treatment solution is carried out in the second treatment portion. Furthermore, since the substrate is sent in and out in the first treatment portion, it is preferable to implement the transfer in a cleaner atmosphere. Thus, by partitioning the interior of the housing according to cleanliness, when sending the substrate in and out of the first treatment portion, the mist of the treatment solution can be prevented from flowing out.

The first and second treatment portions may include, respectively, a cleaning position for cleaning the substrate and a spin dry position for spinning the substrate to throw off a first cleaning fluid.

(2) Another aspect of the present invention is to provide a liquid treatment method, the method comprising:

implementing a first liquid treatment on a substrate by means of a first liquid treatment unit accommodating a first treatment solution containing a metal ion, cleaning with water in the first liquid treatment unit, the substrate after the first liquid treatment is implemented, transferring the cleansed substrate, together with adsorbed moisture, by means of a transfer unit, to a second liquid treatment unit, and implementing a second liquid treatment, by means of the second liquid treatment unit, on the transferred substrate.

A component of the first treatment solution on the substrate dries during the transfer to prevent particles from forming on the substrate.

(3) Another aspect of the present invention is to provide a liquid treatment method, the method comprising:

implementing a first liquid treatment on a first surface of a substrate by means of a first liquid treatment unit accommodating a first treatment solution containing a metal ion, turning during transfer to a second liquid treatment equipment by means of a transfer unit, upside down front and back surfaces of the substrate on which the first liquid treatment is implemented on the first surface, and implementing, by means of the second liquid treatment unit, a second liquid treatment on a second surface of the substrate of which front and back surfaces are turned upside down.

The substrate is turned upside down during the transfer from the first liquid treatment unit to the second liquid treatment unit. Accordingly, the first and second liquid treatment can be efficiently implemented on the first and second surfaces of the substrate.

BRIEF DESCRIPTION OF THE DRAWINGS

FIG. 24 is a flow chart showing a flow of cleaning implemented in a cleaning unit.

FIG. 25 is a flow chart showing a process flow in a manufacturing method of a semiconductor device according to an embodiment of the present invention.

FIG. 27 is a flow chart showing a process flow in a manufacturing method of a semiconductor device according to another embodiment of the present invention.

Figure 1:
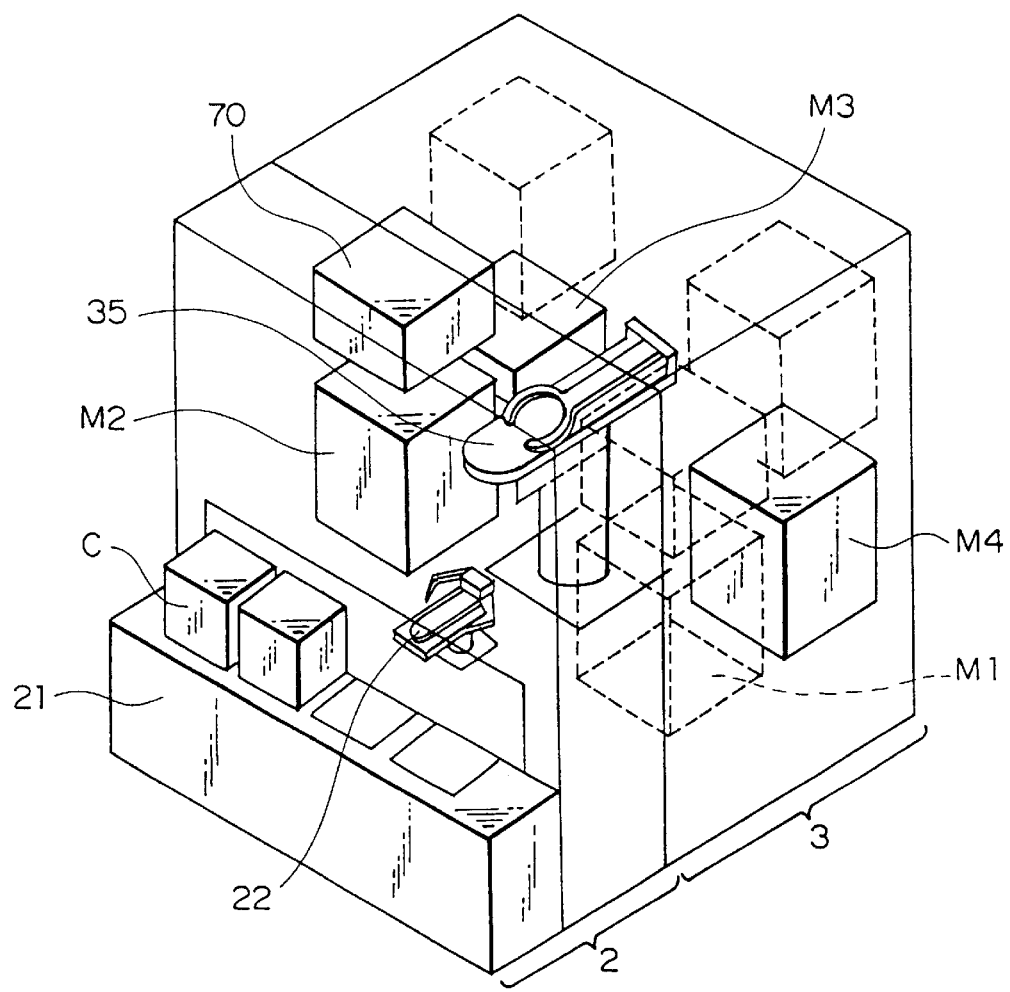
FIGS. 1 through 4 each are perspective, plan, front and side views of an embodiment of a plating system according to the present invention.

DESCRIPTION OF THE PREFERRED EMBODIMENTS (First Embodiment)

FIGS. 1 through 4 each are a perspective view, a plan view, a front view and a side view of a plating system 1 according to an embodiment of the present invention. In the following, with reference to FIGS. 1 through 4, the plating system 1 involving the present embodiment will be explained.

The plating system 1 comprises a carrier station 2 sending in and out and transferring a semiconductor wafer W (hereafter, refers to as wafer W), and a process station 3 implementing actual treatment on the wafer W.

The carrier station 2 comprises a susceptor 21 ford disposing the wafer W and a sub-arm 22 as a second transfer means for transferring the wafer W.

On the susceptor 21, in an X direction in the drawing, for instance four carrier cassettes Care disposed. In each carrier cassette, a plurality, for instance 25 sheets, of wafers W are accommodated. The wafers being disposed equidistant apart in a vertical direction.

The sub-arm 22 is capable of, in addition to moving on a rail disposed in an X direction in the drawing, elevating in a vertical direction (Z direction) and spinning in a level plane. The sub-arm 22 allows access to the interior of the carrier cassette C disposed on the susceptor 21 to take out an untreated wafer W and accommodate a treated wafer W in the carrier cassette C. Furthermore, the sub-arm 22 delivers the wafer before and after the treatment between the process station 3.

The process station 3 has an appearance of a cubic or parallelepiped box, an entire surroundings thereof being covered by a housing 31 made of corrosion resistant material, such as for instance resin or a metal plate of which surface is coated by resin.

Inside the process station 3, a treatment space S that constitutes a treatment chamber is formed in an approximately cubic or parallelepiped box.

Figure 2:
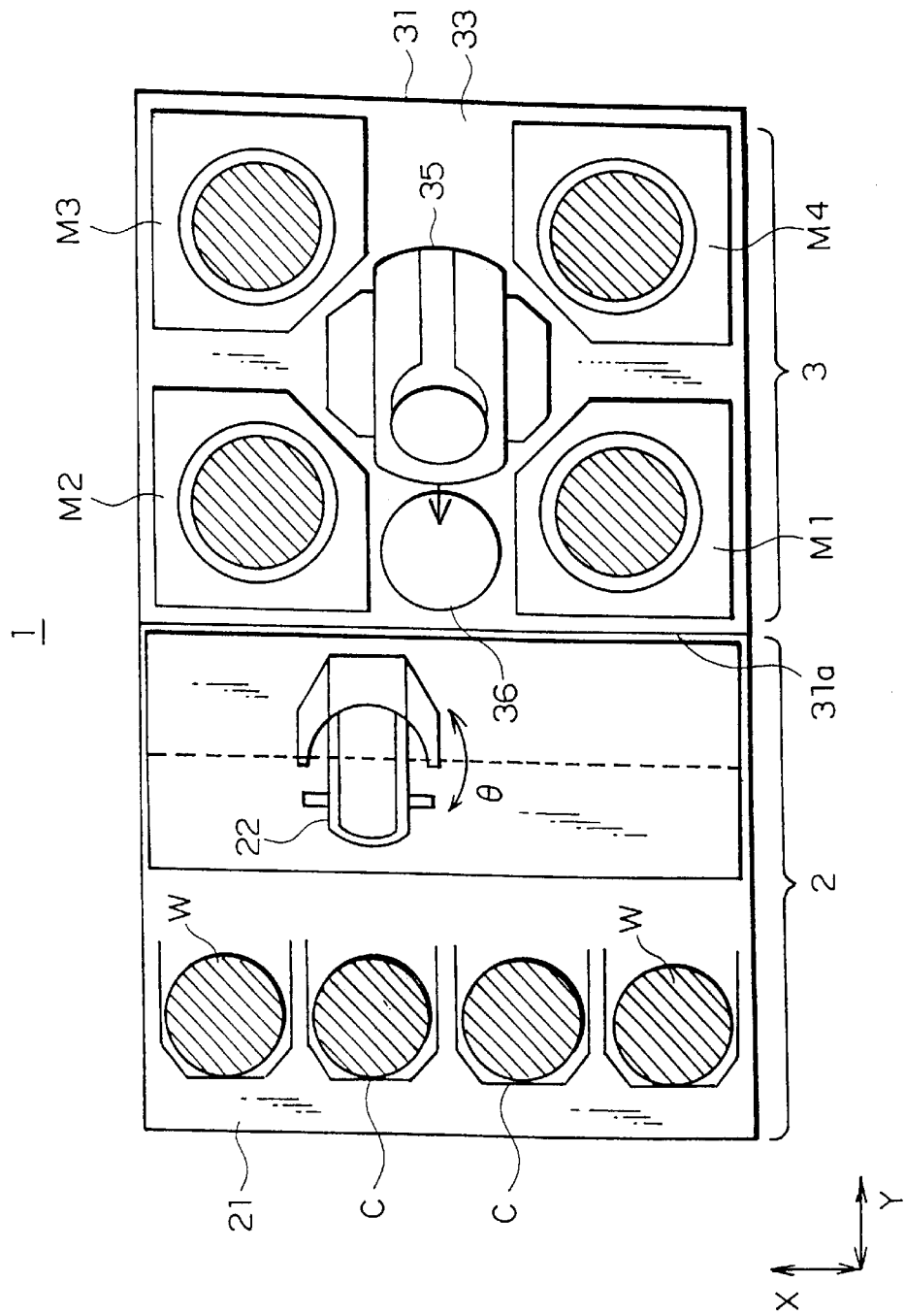

To a bottom of the treatment space S, a base plate 33 is attached. As shown in FIGS. 1 and 2, in an approximate center of the base plate 33, a main-arm 35 is disposed as a first transfer mechanism for transferring the wafer W. Furthermore, in the surroundings of the main-arm 35 on the base plate 33, four sets of plating units M1 through M4 are disposed.

The main-arm 35 is capable of elevating in a Z direction and spinning in a level plane. The main arm 35 is provided with two upper and lower wafer holders 35a capable of extending in an approximate level plane. By extending these wafer holders 35a, the main-arm 35 can deliver the wafer W before and after the treatment in the treatment unit disposed in the surroundings of the main-arm 35. Furthermore, the main-arm 35 can move in a vertical direction to access to an upper side treatment unit. Accordingly, the main-arm 35 can transfer the wafer W from a treatment unit on a lower tier side to a treatment unit on an upper tier side. Alternatively, the main-arm 35 can transfer the wafer from the treatment unit on the upper tier side to the treatment unit on the lower tier side.

Furthermore, the main-arm 35, being provided with a function of turning upside down a held wafer W, can turn upside down the wafer W during the transfer of the wafer W between the treatment units. The function of turning upside down the wafer W is not an indispensable function of the main-arm 35.

Above the treatment unit, on a closer side to the carrier station (that is, above the plating units M1 and M2), for instance two of other treatment units are disposed. To the other treatment unit corresponds, for instance a cleaning unit 70 as a second treatment unit.

Since a plurality of treatment units are disposed in multi-tiers in an up and down direction, the utility and efficiency of an area of the plating system 1 can be improved.

Figure 3:
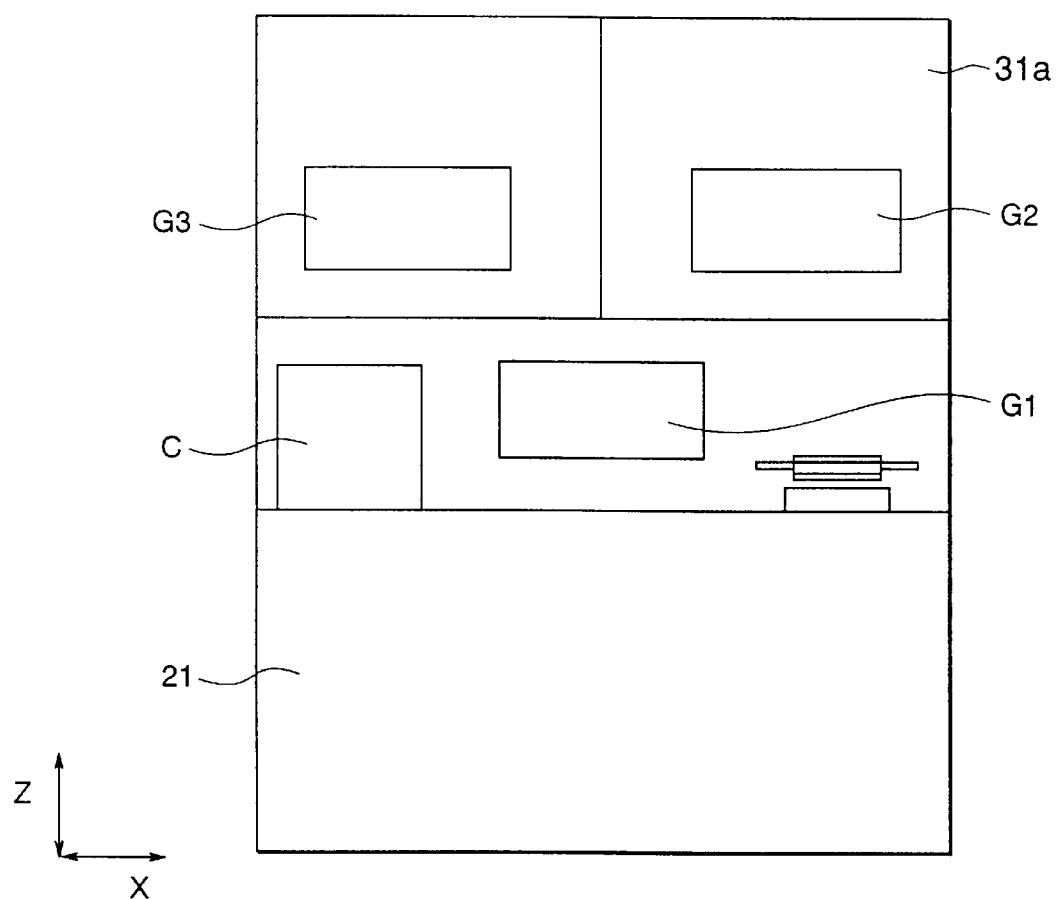
Figure 4:
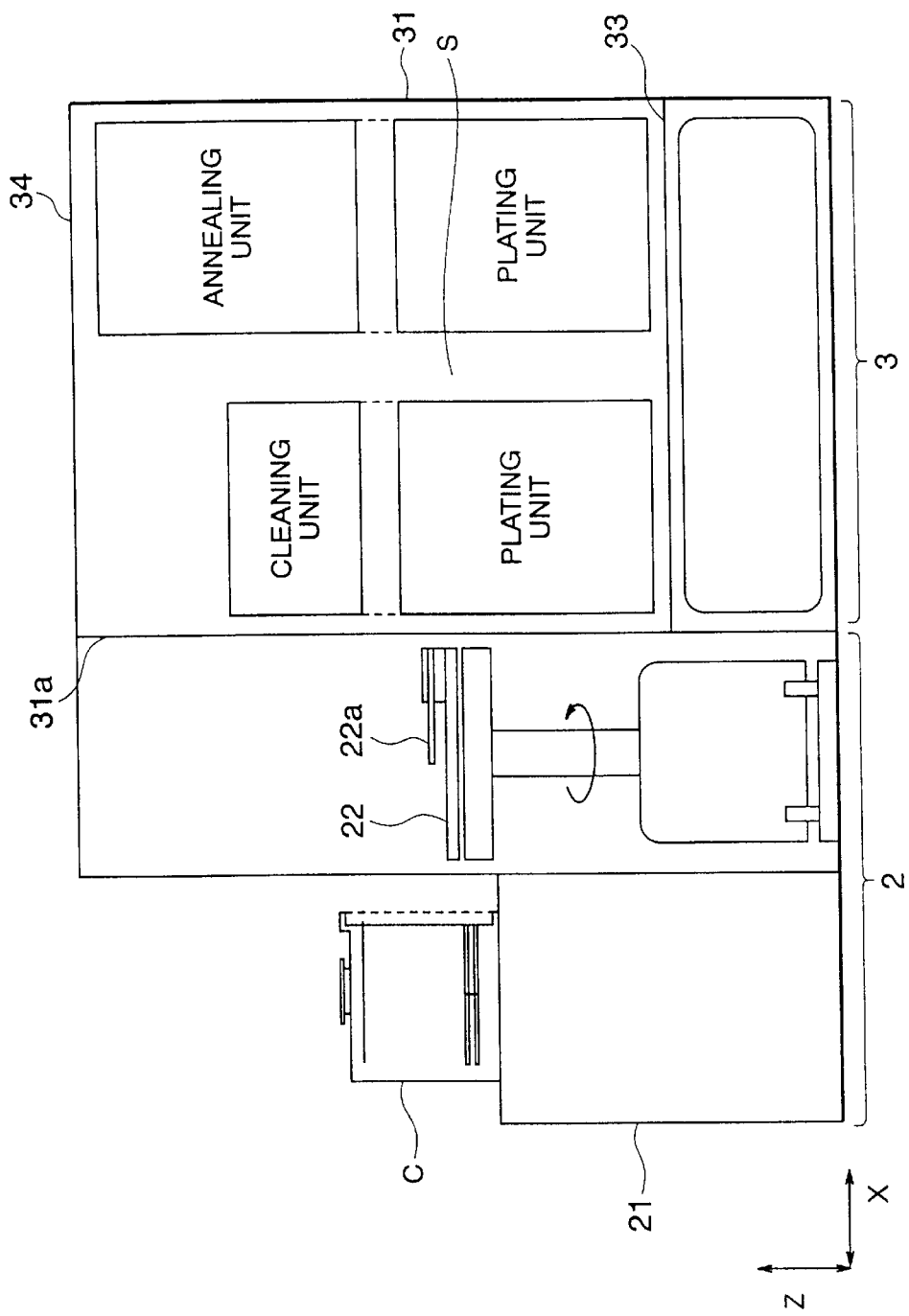

Of the housing 31 of the process station 3, a housing 31a disposed at a position facing the carrier station 2 is provided, as shown in FIG. 3, with three openings G1 through G3 that can be opened.

Among these openings, the opening G1 is disposed at a position corresponding to a middle susceptor 36 disposed between the plating units M1 and M2 disposed on the lower tier side. The opening G1 is used when an untreated wafer W taken out of the carrier cassette C by the sub-arm 22 is sent to the process station 3. When sending the wafer W, the opening G1 is opened, the sub-arm 22 extending the wafer holder 22a holding the untreated wafer W to dispose the wafer W on the middle susceptor 36. The main-arm 35 accesses the middle susceptor 36, holds the wafer W disposed on the middle susceptor 36 and transfers it into the treatment unit such as the plating units M1 through M4.

The remaining openings G2 and G3 are disposed at positions corresponding to the cleaning unit 70 located on a side closer to the carrier station 2 in the treatment space S.

The sub-arm 22 directly accesses through one of these openings G2 and G3 the cleaning unit 70 located on the upper tier side to receive a treated wafer W. Accordingly, the wafer W cleansed in the cleaning unit 70 is prevented from touching the stained main-arm 35, thus avoiding to contaminate the wafer.

Furthermore, in the treatment space S, an airflow is formed directed from above to below. A clean air supplied from outside of the plating system 1 is fed from an upper portion of the treatment space S, flowing through the cleaning unit, plating units M1 through M4 to outside the plating system 1 from the base portion of the treatment space S.

By flowing a clean air from up to down in the treatment space S, the air is prevented from flowing from the plating units M1 through M4 on the lower tier side to the cleaning unit 70 on the upper tier side. Accordingly, the cleaning unit 70 side can always maintain a clean atmosphere.

Furthermore, the interiors of the respective treatment units such as the plating units M1 through M4 and cleaning unit 70 are maintained at a lower pressure than in the treatment space S. Accordingly, the air in the treatment space S flows from the treatment space S side to the insides of the respective treatment units, therefrom being exhausted outside the plating system 1. Accordingly, contamination can be prevented from diffusing from the treatment unit side into the treatment space S.

(Detailed Explanation of Plating Unit)

Figure 5:
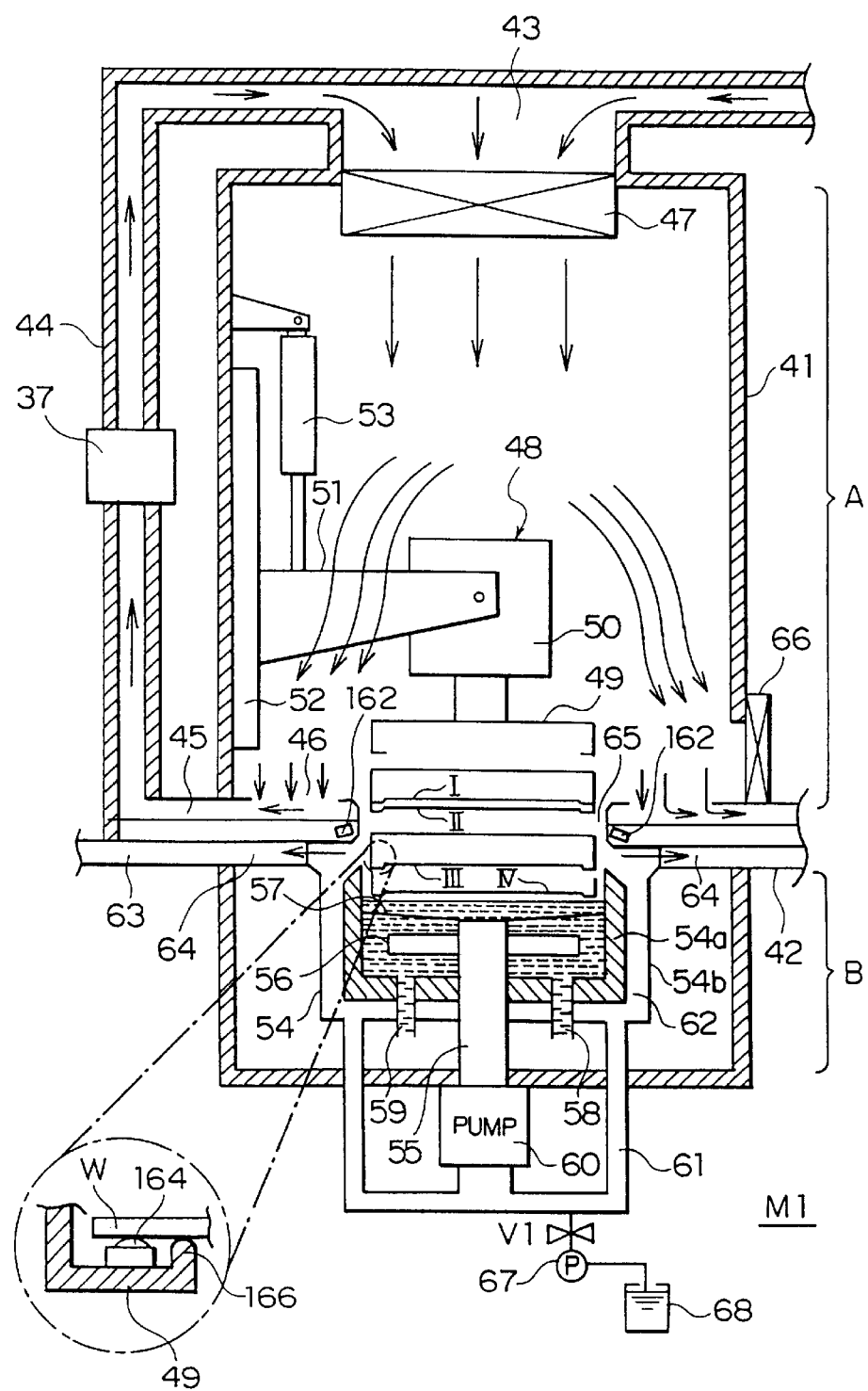
FIG. 5 is a vertical section of an embodiment of a plating unit according to an embodiment of the present invention.

FIG. 5 is a vertical section of a plating unit M1. As shown in FIG. 5, an entire plating unit M1 is covered by an airtightly structured housing 41. The housing 41 is also made of corrosion resistant material such as a resin or the like.

The interior of the housing 41 is partitioned, by a separator 42 having a built-in exhaust path, into two portions. A first treatment portion A disposed above the separator 42 and a second treatment portion B disposed under separator 42. The separator 42 prevents the contamination from diffusing from the second treatment portion B side to the upper first treatment portion A side.

In the center of the separator 42, there is disposed a passage opening 65. Through the passage opening 65, a wafer W held by a driver 48 described below comes and goes between the first and second treatment portions A and B.

To the housing at a boundary between the treatment portions A and B, an opening and a gate valve 66 to open the opening are disposed. By shutting the gate valve 66, the interior of the plating unit M1 is shielded from the exterior treatment space S, thereby the contamination being prevented from diffusing from the plating unit M1 to the exterior treatment space S.

Furthermore, the plating units M1 through M4 each are configured to be operated independently from each other and to be separately detached from the plating system 1. Accordingly, one of the plating units M1 through M4 can be stopped operating to be replaced by another plating unit. As a result, maintenance can be implemented with ease for each unit.

To the first treatment portion A, a driver 48 as a substrate holding mechanism is disposed to hold the wafer W approximately level to spin. The driver 48 is configured of a holder 49 for holding the wafer W and a motor 50 for spinning the wafer W together with the holder 49 in an approximately level plane. To a cover of the motor 50, a support beam 51 is attached to support the driver 48. One end of the support beam 51 is attached through a guide rail 52 to an inner wall of the housing 41 to be elevated. The support beam 51 is further attached through a cylinder 53 to the housing 41. By driving the cylinder 53 and motor 50, the driver 48 can be moved up and down.

As shown in FIG. 5, the driver 48 moves the wafer W up and down between essentially following four positions (I) through (IV). The four positions are a transfer position (I) for transferring in and out the wafer W, a cleaning position (II) for cleaning a surface being treated on a lower surface side of the wafer W, a spin dry position (III) for implementing the spin drying described below, and a plating position (IV) for plating the wafer W in an immersed state in a plating solution.

Inside the driver 48, an elevation mechanism (not shown in the drawing) is disposed to elevate the wafer W alone. By actuating the elevation mechanism, without changing a height of the driver 48 itself, only a height of the wafer W can be changed inside the driver 48.

The elevation mechanism is actuated when a cathode contact 164, an electric contact, which applies a voltage when coming into contact with a lower surface periphery of the wafer W, and the wafer W come into or leave from contact. For instance, when cleaning the cathode contact 164, the elevation mechanism raises the wafer W to expose a contact surface, thereby water ejected from a nozzle cleansing the cathode contact 164 with ease. A sealing portion 166 comes into contact with a periphery of the wafer W to prevent the treatment solution from intruding into the holder 49.

To the second treatment portion B, a plating solution bath 54 is disposed immediately below the driver 48 to accommodate a plating solution for copper plating such as for instance copper sulfate.

The plating solution bath 54 is structured in a double bath, outside an inner bath 54a an outer bath 54b being disposed approximately concentrically. A height of the inner bath 54a is determined so that a liquid level of the plating solution when the inner bath 54a is filled by the plating solution is higher than that of the wafer W in the plating position (IV).

An ejection tube 55 extends from an approximate center of a base in the inner bath 54a to an approximate midway in a depth direction to eject the plating solution from the base of the inner bath 54a to the upper portion thereof. In the surroundings of the ejection tube 55, an electrode 56 is disposed so that it functions as an anode when implementing electrolytic plating. Between an end periphery of the ejection tube 55 and the inner bath 54a, a membrane 57 is disposed to prevent impurities mingling from the electrode 56 during electrolytic plating from floating above the liquid level of the plating solution to disturb the plating.

At positions out of center of the base in the inner bath 54a, there are disposed circulation piping 58 and 59 for circulating the plating solution. The plating solution inhaled by the circulation piping 59 is exhaled from the circulation piping 58 by means of a pump not shown in the drawing.

Between the outer bath 54b and an exterior surface of the inner bath 54a, there is formed a passage 62 wherein the plating solution flows. Furthermore, to the base of the outer bath 54b, piping 61 is connected to return the plating solution flowed in the passage 62 in the inner bath 54a. The piping 61 is connected through the pump 60 to the ejection tube 55. By actuating the pump 60, the plating solution overflowed from the inner bath 54a into the passage 62 and piping 61 is ejected from the ejection tube 55 to return again into the inner bath 54a.

In the first treatment portion A, a mechanism such as a clean room is disposed to circulate a stream of clean air.

That is, at the uppermost of the housing 41, an air nozzle 43 is disposed to flow the air downwardly toward the first treatment portion A, to the air nozzle 43 air feed piping 44 being connected to feed the air. An upstream side in an airflow direction of the air feed piping 44 is connected to an air passage 45 embedded in the uppermost side in the separator 42.

On an upper surface of the separator 42, an air inlet 46 for taking in the air is formed to take in the air that has flowed down in the first treatment portion A. Furthermore, in the middle of the air feed piping 44, a fan (not shown) or a compressor 37 is disposed to flow the air, the air taken in at the air inlet 46 being sent through the air feed piping 44 to the air nozzle 43. To the air nozzle 43, a filter 47 is disposed to remove dust or dirt in the air. Clean air leaving the air nozzle 43 is drawn in the air inlet 46 of the separator 42 to form a down flow in the first treatment portion A. Thus, by flowing the cleansed air in a downward direction in the drawing, the inside of the treatment portion A is maintained in a clean atmosphere.

On the other hand, a space in the second treatment portion B below the separator 42 is independent from that in the first treatment portion A. Accordingly, the air flowing in the first treatment portion A does not flow into the second treatment portion, and vice versa, the air in the second treatment portion does not flow into the first treatment portion A. By preventing the air from flowing from the treatment portion B side to the treatment portion A side, an atmosphere in the treatment portion A is maintained clean.

Below the separator 42, an exhaust 64 is disposed. The exhaust 64 is connected to a not shown exhaust system. Minute particles or the like of the plating solution scattered in the second treatment portion B are drawn in the exhaust 64 to be exhausted together with the exhaust outside the plating system 1. Thus, by exhausting the minute particles contained in the air in the treatment portion B outside the plating system 1, the atmospheres in the plating units M1 through M4 and the plating system 1 are maintained clean.

To the separator 42, at the inner wall lower portion of the passage opening 65, a plurality of cleaning nozzles 162 are disposed. To a lower surface of the wafer W stopped at the cleaning position, from the cleaning nozzles 162, for instance purified water is ejected to cleanse.

At the portion of the passage opening 65, an air curtain may be formed in a level direction. For instance, on one side of the separator 42 a nozzle is disposed to blow air in a plane, and on the opposite side of the separator 42 an inlet is disposed to inhale the air gone past the upper portion of the plating solution bath 54. The air drawn by the inlet is exhausted outside the plating system 1.

By thus forming an air curtain at a boundary between the treatment portions A and B, mist containing the plating solution in the plating solution bath 54 can be prevented from diffusing into the treatment portion A side.

Furthermore, in the plating unit M1, a temperature controller or humidity controller may be disposed. By controlling the temperature or humidity in the plating unit M1, the mist of the plating solution or the like, resultantly the contamination of the air in the plating unit M1 can be prevented from occurring.

(Detailed Explanation of Cleaning Unit)

Figure 6:
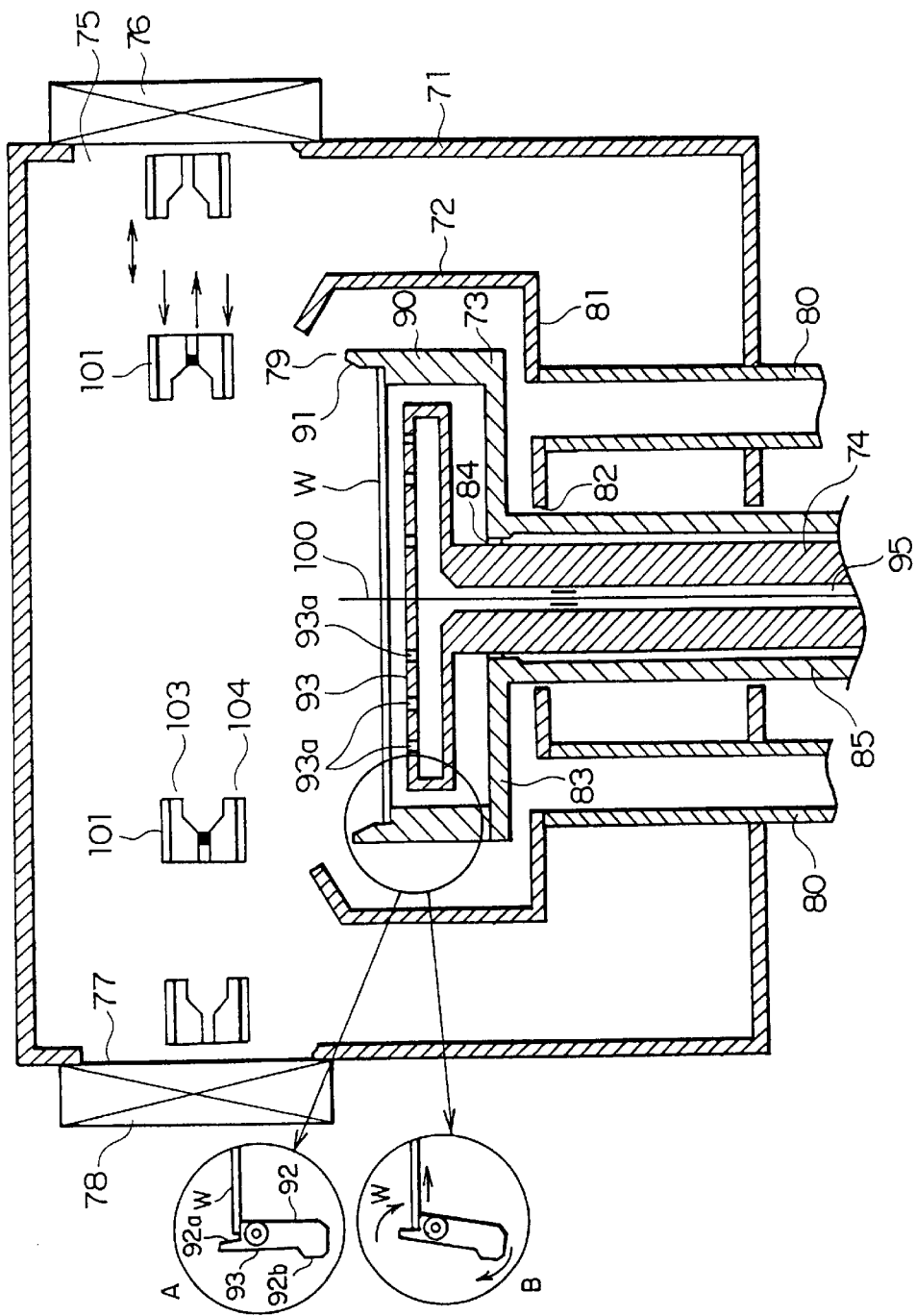
FIGS. 6 and 7 are vertical sections of a cleaning unit according to the present invention.
Figure 7:
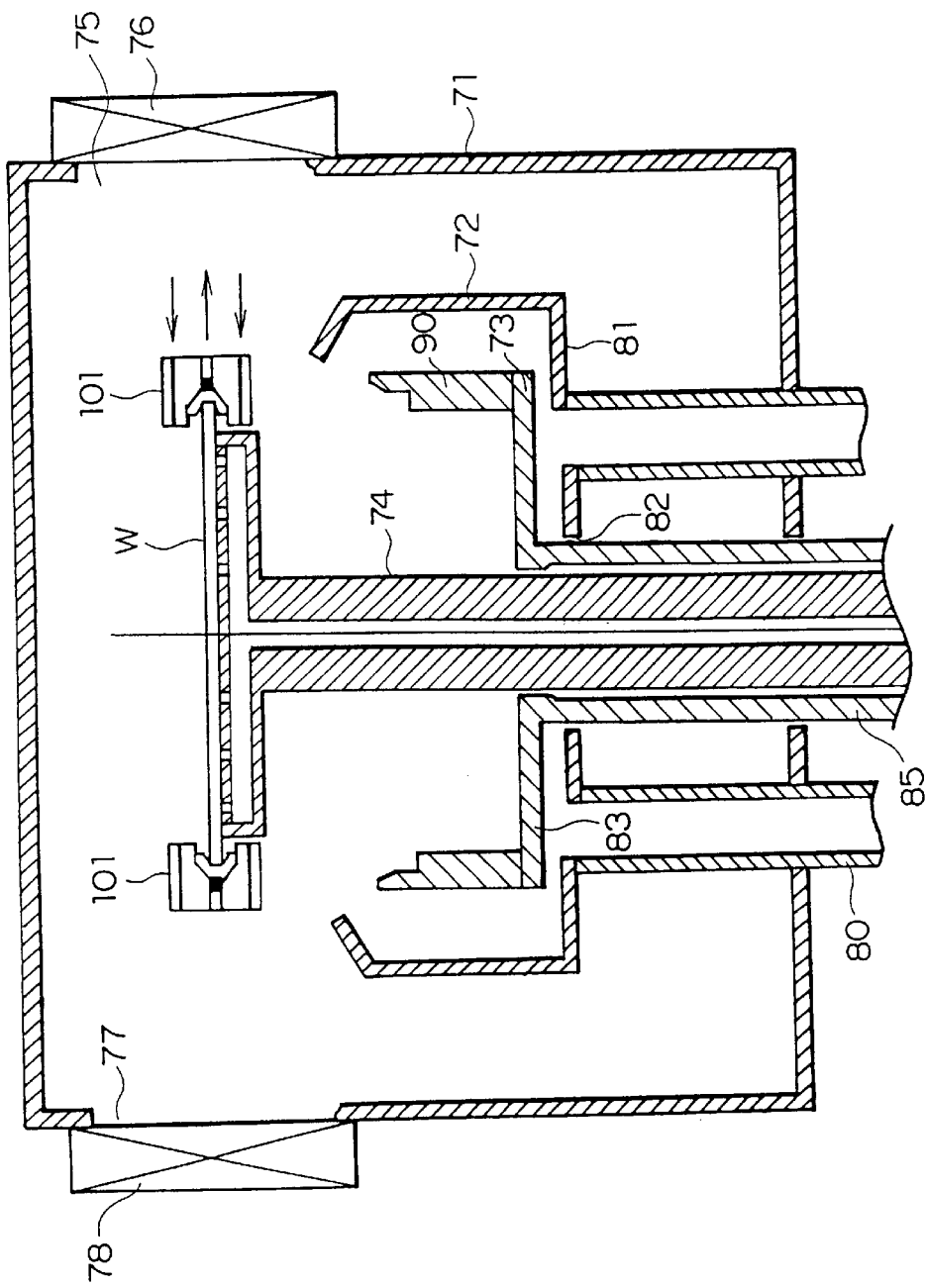

FIGS. 6 and 7 are vertical sections showing schematically a structure of a cleaning unit 70 involving the present embodiment.

In the cleaning unit 70, in a housing 71 of approximately parallelepiped box, a fixed cup 72 is disposed. Inside the fixed cup 72, a spinning cup 73 and a lifter 74 are disposed.

In the housing 71, an opening 75 facing the main-arm 35 and an opening 77 facing the sub-arm 22 side are disposed. To the openings 75 and 77, gate valves 76 and 78 are disposed to open and shut these, respectively.

By closing the gate valves 76 and 78, the cleaning unit 70 is shielded from the treatment space S, thereby contaminated air being prevented from diffusing from the interior of the cleaning unit 70 to the treatment space S.

Furthermore, in the cleaning unit 70, a pressure controller for maintaining a lower pressure therein than the outside pressure, a temperature or humidity controller may be disposed. By maintaining the pressure inside the cleaning unit 70 lower than the pressure in the treatment space S, the mist of the plating solution or the like can be prevented from diffusing from the cleaning unit 70 to the outside thereof. Furthermore, by controlling the temperatures and humidity, the mist of the plating solution or the like can be prevented from being generated.

A spinning cup 73 rotates holding the wafer W. On each of upper and lower surfaces of the rotating wafer W, cleaning fluid is supplied to cleanse the wafer W.

On a sidewall of the spinning cup 73, a chuck member 92 is disposed to fix the wafer W. As shown in a small circle of FIG. 6, the chuck member 92 varies in its inclination with respect to the wafer W. As shown in a small circle A of FIG. 6, when the spinning cup 73 stands still, a tip end 92a of the chuck member 92 separates itself from a periphery of the wafer W, thereby enabling the wafer W to be detachable. On the other hand, as shown in a small circle B of FIG. 6, when the spinning cup 73 is in rotation, according to the centrifugal force, the tip end 92a of the chuck member 92 presses against the periphery of the wafer W inwardly in a radius direction. Thereby, the wafer W is fixed.

An edge remover 101 disposed above the spinning cup 73 moves horizontally in a radius direction of a circle having a center at a rotation axis 100 of the spinning cup 73. The edge remover 101 sandwiches the wafer W to cleanse the periphery thereof.

That is, when cleansing the periphery of the wafer W as shown in FIG. 7, the edge remover 101 accesses the wafer W lifted by the lifter 74 to sandwich the periphery of the wafer W. Then, with a piping disposed at a lower side member 104 of the edge remover 101, an aqueous solution of hydrofluoric acid is supplied. The piping disposed at an upper side member 103 sucks the above aqueous solution of hydrofluoric acid, thereby enabling to cleanse the periphery of the wafer W.

(Detailed Explanation of Annealing Unit)

Figure 8:
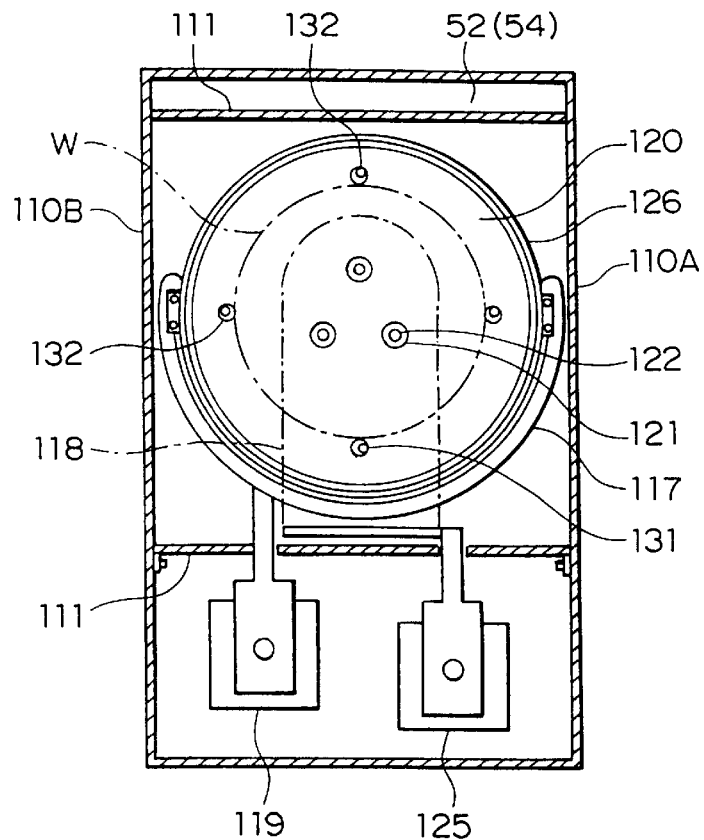
FIGS. 8 and 9 each are plan and vertical sectional views of an annealing unit according to the present invention.
Figure 9:
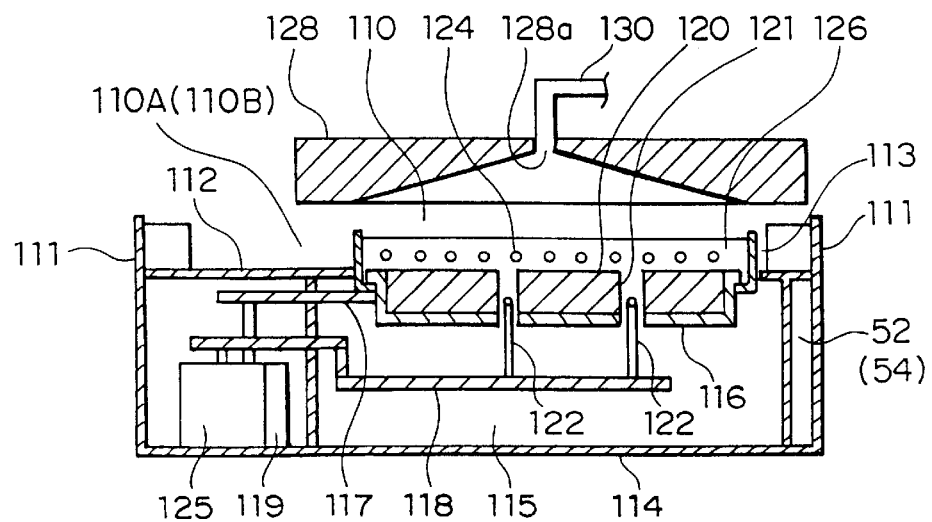

FIGS. 8 and 9 are plan and sectional views showing a configuration of an annealing unit involving the present embodiment. In FIG. 8, for the purpose of showing the interior, a level shield plate 112 is omitted. A treatment chamber 110 of the annealing unit is comprised of both sidewalls 111 and a level shield plate 112. Furthermore, in front surface (main-arm 35 side) and rear surface sides of the treatment chamber 110, openings 110A and 110B are formed, respectively. In the central portion of the level shield plate 112, a circular opening 113 is formed, and inside circular opening 113 a disc-like susceptor 120 is disposed.

In the susceptor 120, for instance three through holes 121 are disposed. Inside of each through hole 121 a lift pin 122 is inserted unengaged. When loading and unloading the wafer W, the lift pin 122 projects or elevates above a surface of the susceptor 120 to deliver the wafer W between the wafer holder 35a of the main-arm 35.

Along an exterior periphery of the susceptor 120, a shutter 126 consisting of a ring-like band plate in which for instance with a separation of 2° in a circumferential direction, a number of air holes 124 are formed is disposed. The shutter 126 is usually in retreat at a position below that of the susceptor 120. When implementing heat treatment such as annealing, as shown in FIG. 9, the shutter 126 ascends to a position higher than an upper surface of the susceptor 120 to form a ring-like sidewall between the susceptor 120 and a cover body 128. A downflow of air or inert gas such as nitrogen sent in from a not shown gas supply is effected to flow from the air holes 124 uniformly along a circumferential direction into an annealing unit.

In the center of the cover body 128, an exhaust 128a is disposed to exhaust a gas liberated from the surface of the wafer W during the heat treatment. An exhaust pipe 130 is connected to exhaust 128a. The exhaust pipe 130 is communicated with a duct (not shown in the drawing) on a front face side of the unit (main-arm 35 side).

A machine chamber 115 is formed of the horizontal shield plate 112, both sidewalls 111 and the base plate 114. Inside the machine chamber 115, a susceptor support plate 116, a shutter arm 117, a lift pin arm 118, a cylinder 119 for driving the shutter arm to elevate and a cylinder 125 for driving the lift pin arm to elevate are disposed.

As shown in FIG. 8, in the susceptor 120, at surface positions thereof 120 where the periphery of the wafer W is disposed, plurality, for instance four, of wafer W guide support projections 131 are disposed.

Inside the susceptor 120, an electric heater (not shown in the drawing) such as Nichrome wire or the like is disposed. The electric heater is heated to maintain the susceptor 120 at a prescribed temperature.

(Flow of Treatment in Plating System 1)

Figure 10:
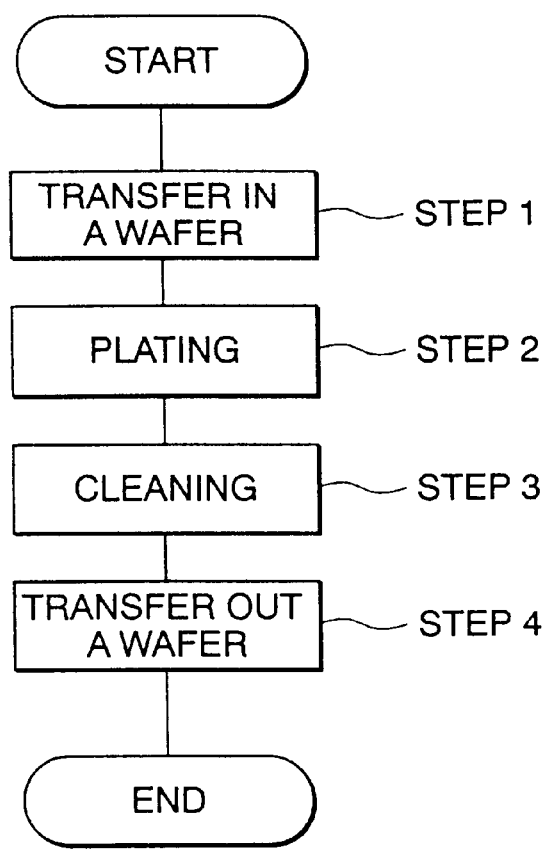
FIG. 10 is a flow chart showing a process flow of an entire plating system according to the present invention.

FIG. 10 is a flow chart showing a flow in an entire plating system 1.

As shown in FIG. 10, the wafer W is transferred in the plating system 1 (step 1) to implement the plating and cleaning (step 2 to 3), thereafter being transferred out of the plating system 1 (step 4).

The wafer W is transferred in the plating system 1 in the following way.

On the susceptor 21, by the use of a transfer robot not shown in the drawing, the carrier cassette C accommodating one lot, for instance 25 sheets, of untreated wafers W is disposed.

The sub-arm 22, after confirming that the untreated wafers W are set in the carrier cassette C, moves in front of the carrier cassette C. The sub-arm 22 extends the wafer holder 22a into the carrier cassette C to take out the untreated wafer W accommodated therein, thereafter disposing on the middle susceptor 36 in the process station.

In the neighborhood of the susceptor 21, an alignment controller (not shown in the drawing) may be disposed to align, before transferring the wafer W onto the sub-arm 22 or middle susceptor 36a, a direction (alignment) of the wafer W by means of the alignment controller.

When the untreated wafer W is disposed on the middle susceptor 36, the main-arm 35, conceiving the disposition of the wafer W, starts actuating and accesses the middle susceptor 36 to receive the untreated wafer W. The main-arm 35 that has received the untreated wafer W accesses the plating unit, for instance the plating unit M1, disposed on the lower tier side of the treatment space S to send the untreated wafer W in the plating unit M1.

(Detailed Explanation of Plating Process)

In the following, with reference to FIGS. 11 through 24, a flow of treatment in the plating unit M1 will be explained.

Figure 11:
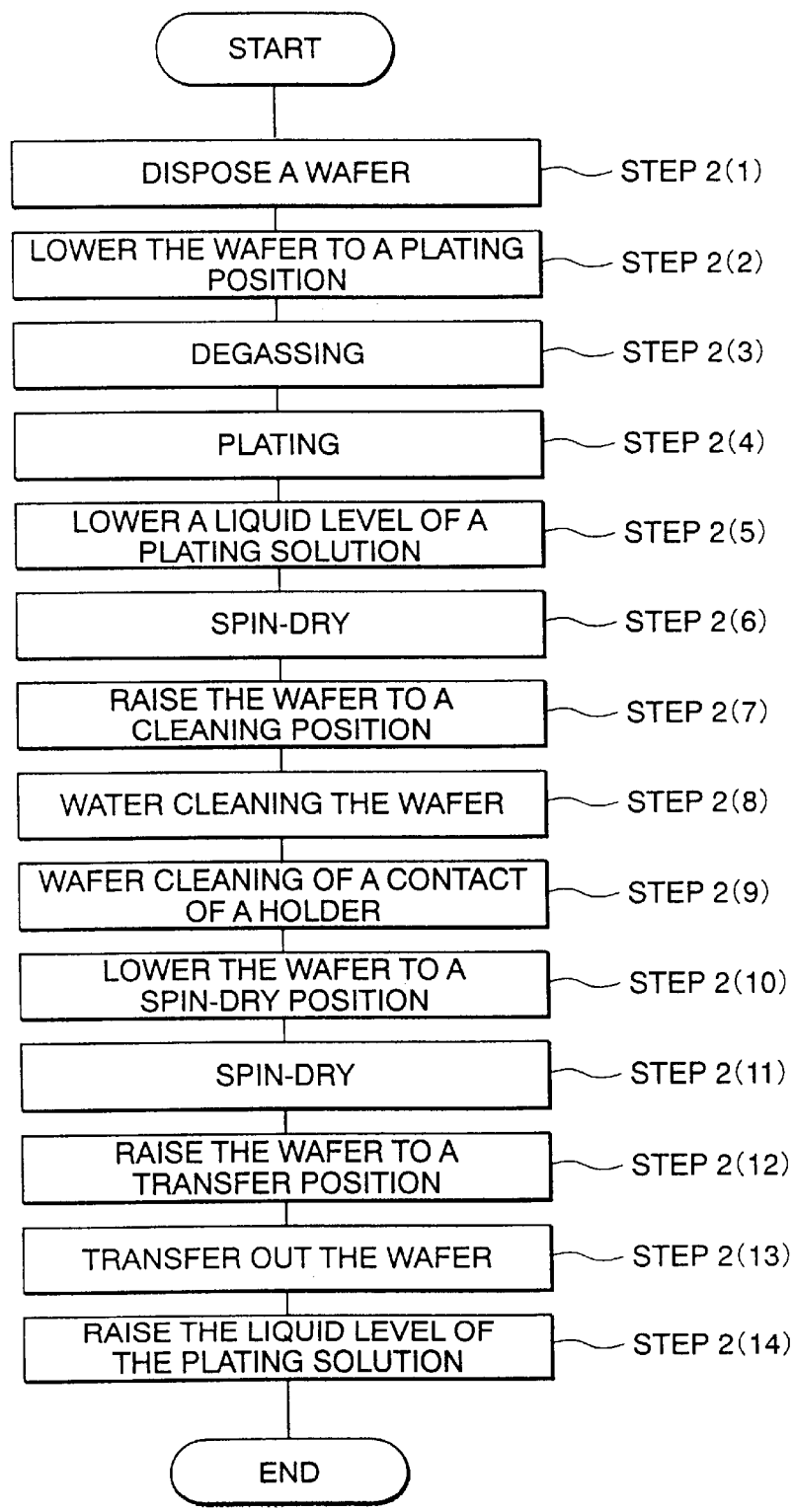
FIG. 11 is a flow chart showing a flow of plating process implemented in a plating unit.

FIG. 11 is a flow chart showing a flow of plating process implemented in the plating unit M1, FIGS. 12 through 23 being diagrams showing schematically the respective steps of the plating.

Figure 12:
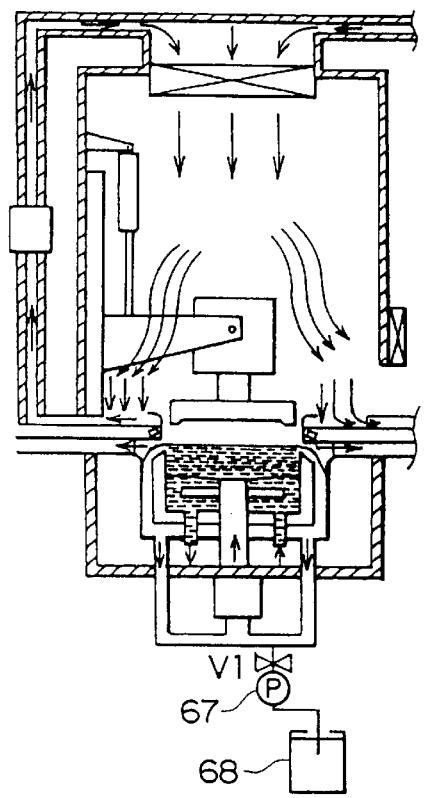
FIGS. 12 through 23 are diagrams showing schematically the respective steps of plating.

The main-arm 35, after receiving the untreated wafer W from the middle susceptor 36, accesses the plating unit M1. That is, the gate valve 66 of the plating unit M1 is opened, the main-arm 35 holding the untreated wafer W proceeding in the first treatment portion A. The main-arm 35 delivers the untreated wafer W to the holder 49 waiting in the transfer position (I) as shown in FIG. 12 (step 2 (1)). At that time, the plating solution bath 54 is full of the plating solution.

At that time, the interior of the plating unit M1 is maintained at a pressure lower than that in the treatment space S. Accordingly, when the gate valve 66 is opened, though the air flows from the treatment space S side toward the inside of the plating unit M1, the mist including the plating solution does not flow out of the inside of the plating unit M1 to contaminate the treatment space S.

Figure 13:
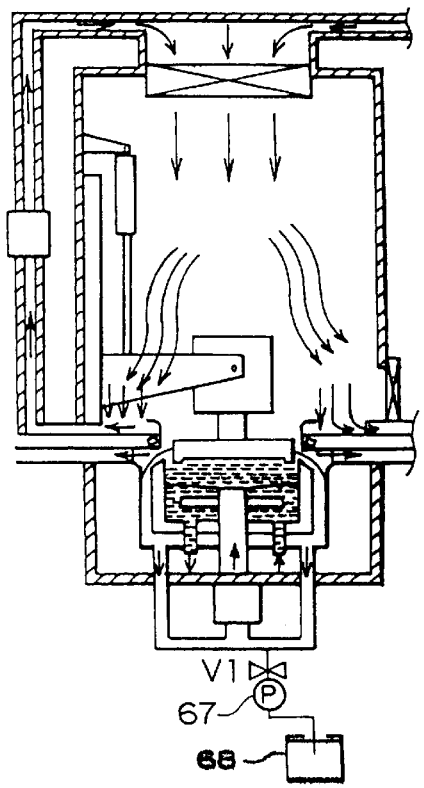

After having set the untreated wafer W in the holder 49 of the driver 48, the gate valve 66 is shut, the cylinder 53 being driven to lower the wafer W to the plating position (IV) (step 2 (2), FIG. 13).

By the lowering operation, a surface being treated on the lower surface side of the wafer W held by the holder 49 comes into contact with the liquid level of the plating solution in the plating solution bath 54. When the wafer W and the liquid level of the plating solution coming into contact, sometimes there form air bubbles on the surface of the wafer W. When plating the wafer W with air bubbles on its surface, a plating layer formed on the surface of the wafer W is likely to be non-uniform.

Figure 14:
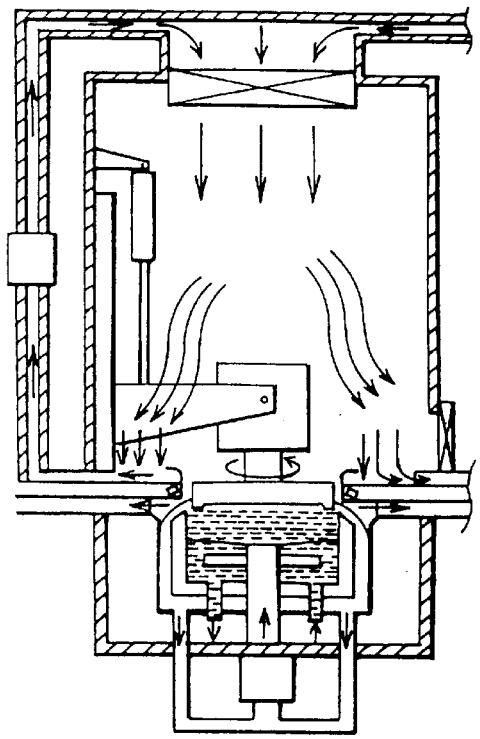
Figure 15:
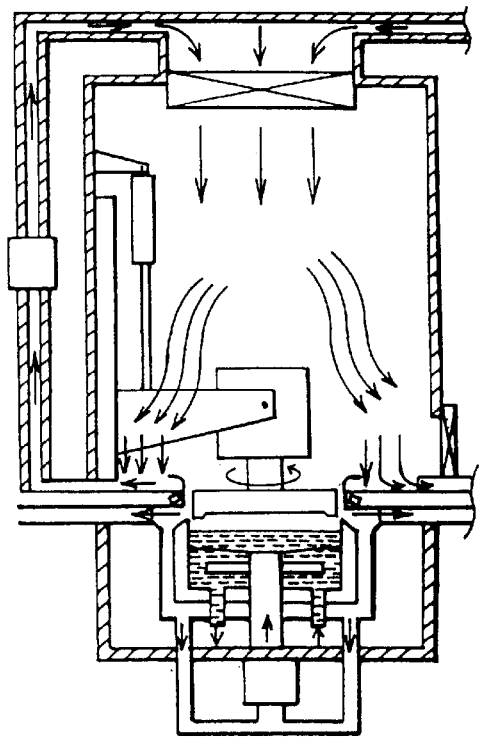

Accordingly, with the wafer W being in contact with the liquid level of the plating solution, the motor 50 of the driver 48 is actuated to spin the wafer W in an approximately level plane, thereby degassing from the surface of the wafer W (step 2 (3), FIG. 14).

After sufficient degassing, with the same height maintained, a rotation speed of the motor 50 is decreased, followed by an application of a voltage between the wafer W and the electrode 56 in the plating solution bath 54 to start plating (step 2 (4)).

When, after the passage of a prescribed time, the plating layer of a sufficient thickness is formed on the wafer W, the application of the voltage is ceased in order to stop the formation of the plating layer. Upon opening a valve V1, a pump 67 for pumping out is simultaneously actuated to return the plating solution into a tank 68, thereby lowering the liquid level in the plating solution bath 54 (step 2 (5)).

Furthermore, the driver 48 is raised to move the wafer W up to the spin dry position (III). In this state, the motor 50 is actuated to spin the wafer W in a horizontal plane to spin dry (step 2 (6), FIG. 15).

Figure 16:
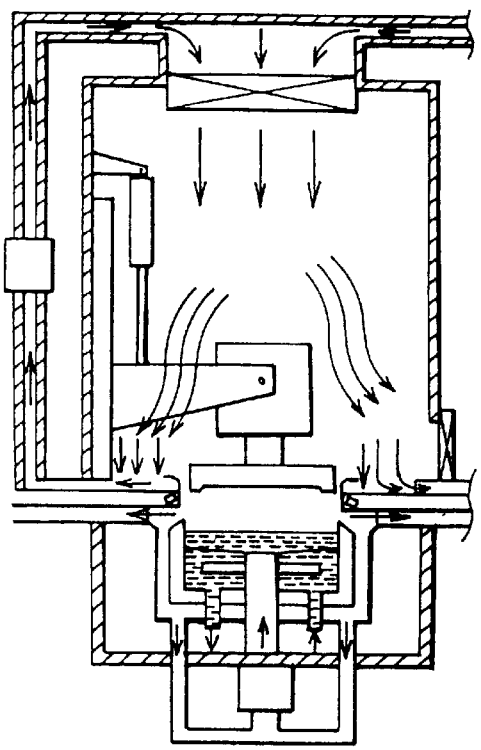

When almost all of the plating solution is removed from the wafer W due to the spin dry, the driver 48 is raised up to the cleaning position (II) (step 2 (7), FIG. 16).

Figure 17:
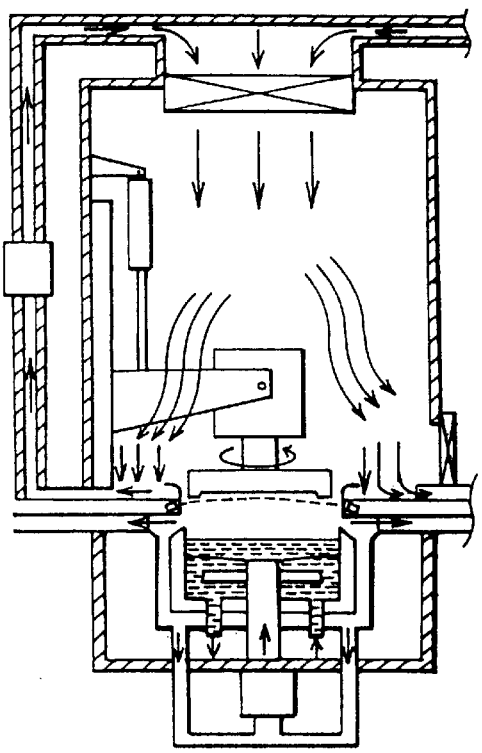
Figure 18:
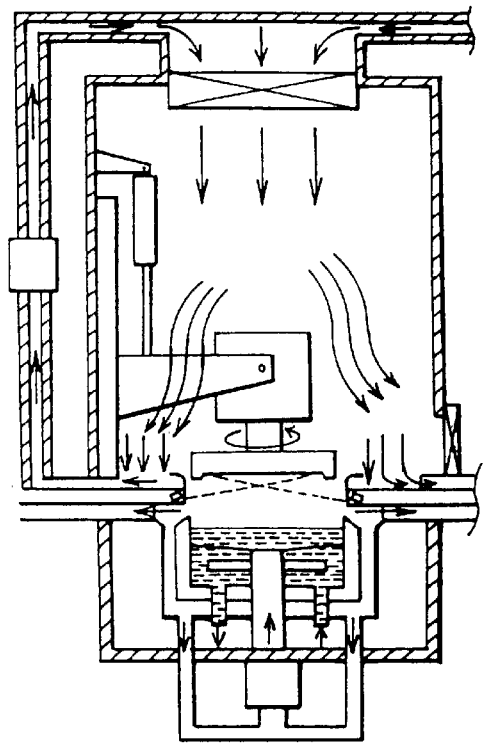
Figure 19:
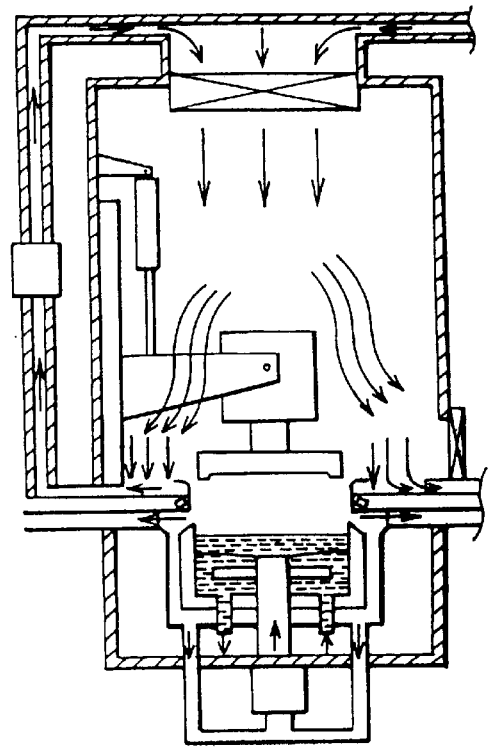

Next, in this state, while driving the motor 50 to spin the wafer W, purified water is ejected from a cleaning nozzle 162 toward a lower surface of the wafer W to cleanse the lower surface of the wafer W (step 2 (8), FIG. 17).

Having completed the cleaning of the lower surface of the wafer W, with the height of the holder 49 maintained as it is, by means of a not shown elevator, the wafer W in the holder 49 is a little raised. The wafer W is raised up to a height where purified water ejected from the cleaning nozzle 162 comes into contact with the cathode contact 164. In this state, purified water is ejected from the cleaning nozzle 162 to cleanse the surface of the cathode contact 164 (step 2 (9), FIG. 18).

Figure 20:
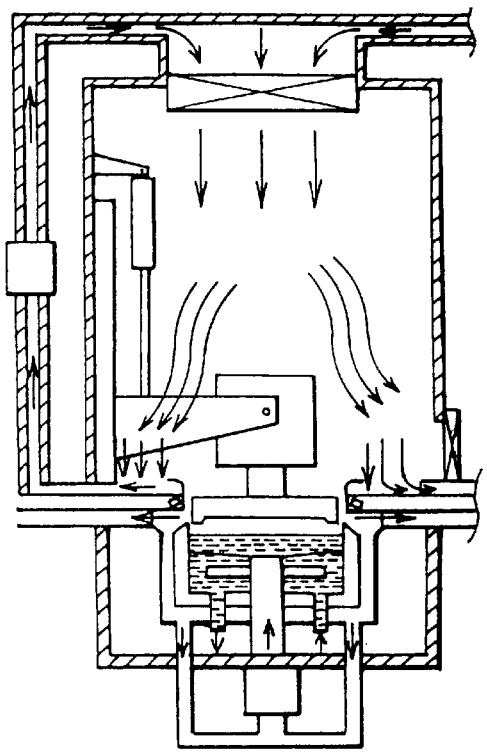
Figure 21:
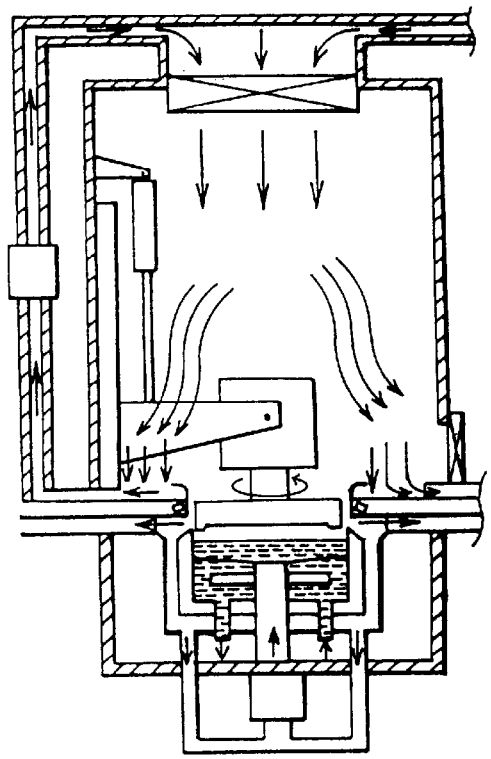

After the cleaning of the cathode contact 164 is over, the wafer W is lowered down to a height where the wafer W comes into contact with the cathode contact 164 (FIG. 19), and furthermore the driver 48 being lowered so that the wafer W comes to the spin dry position (III) (step 2 (10), FIG. 20). Still furthermore, the motor 50 is actuated to spin dry, thereby removing moisture from the wafer W (step 2 (11), FIG. 21)).

Figure 22:
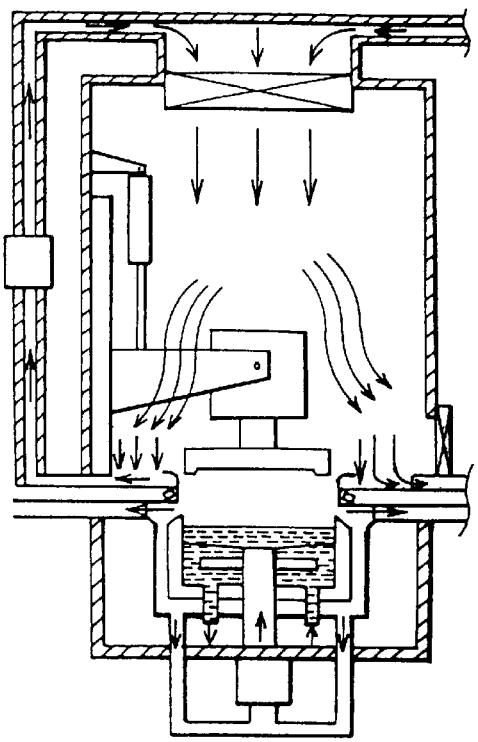
Figure 23:
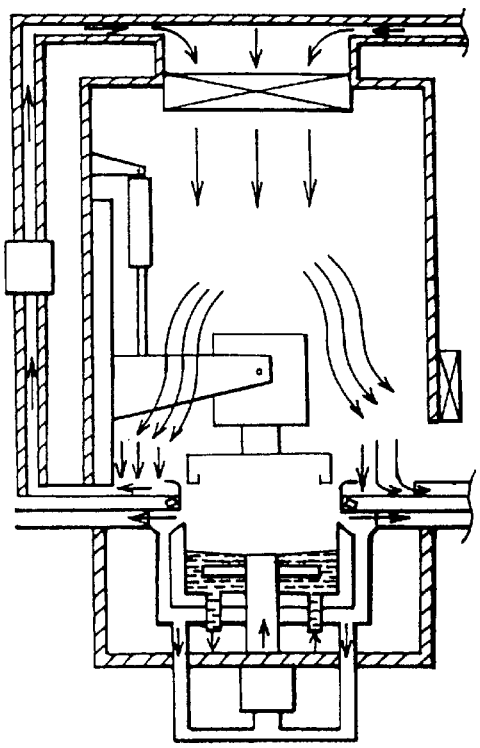

After the spin dry is over, the driver 48 is raised so that the wafer W comes to the transfer position (I) (step 2 (12), FIG. 22). While maintaining the wafer W in this position, the gate valve 66 is opened to transfer out, by means of the main-arm 35, the wafer W that is treated in the plating unit M1 (step 2 (13), FIG. 23).

During the degassing or plating, when bringing the wafer W and the plating solution into or out of contact, or during the spin drying, or during the cleaning, the plating solution scatters outside the plating solution bath 54. However, since the air in the treatment portion B therein the plating solution bath 54 is disposed is always evacuated during the treatment, the plating solution scattered from the plating solution bath 54 is evacuated together with the air. As a result, the treatment portion B is not filled with the mist of the plating solution or the mist containing the plating solution does not diffuse from the interior of the treatment portion B into the treatment portion A or the treatment space S.

In the last spin drying, the drying may be stopped at a state where the wafer W is not completely dried, thereby leaving some moisture thereon. In this case, the wafer W of which surface is a little wet with moisture is transferred from the plating unit M1. As a result, the components of the plating solution are prevented to remain as particles on the surface of the wafer W which may otherwise occur if the moisture is totally dried.

After the completion of the plating step at the plating unit M1, the wafer W is transferred to a treatment unit therein a succeeding treatment is implemented. For instance, the wafer W is transferred in one of other plating units M2 through M4 where the plating solution different in composition from that of plating unit M1 is used to implement the succeeding treatment.

In the course of transferring the wafer from the plating unit M1 to one of subsequent treatment units, for instance, the plating units M2 through M4, or the cleaning unit as the second treatment unit, as needs arise, the main-arm 35, while holding the wafer W, turns upside down front and back surfaces thereof W. For instance, it is such a case when, after a plating layer is formed on a lower surface side of the wafer W at the plating unit M1, the plated surface is directed upwardly to cleanse. Thus, during the transfer of the wafer W, the wafer W can be turned upside down on the main-arm 35. Accordingly, there is no uselessness in the step of the treatment.

When a series of plating steps is over, the main-arm 35 accesses the last one of the plating units M1 through M4 to take out the plated wafer W.

Thereafter, the main-arm 35 moves the wafer holder 35a holding the wafer W to the upper portion of the treatment space S to send the wafer W in the cleaning unit 70 disposed on the upper tier side of the plating units M1 through M4.

At that time, in the treatment space S, a down flow is formed in which, from above to below in the drawing, a clean air flows down. As a result, the air does not flow from the plating units M1 through M4 on the lower tier side to the cleaning unit 70 side on the upper tier side. Accordingly, an atmosphere in the neighborhood of the cleaning unit 70 in the treatment space S is maintained cleaner than that in the neighborhood of the plating units M1 through M4.

(Detailed Explanation of Cleaning Process)

In the following, the cleaning carried out in the cleaning unit 70 as the second treatment unit will be explained.

FIG. 24 is a flow chart (flow chart 3) showing a flow of the cleaning step carried out in the cleaning unit 70.

When the wafer holder 35a of the main-arm 35 holding the plated wafer W approaches the gate valve 76 of the cleaning unit 70, the gate valve 76 is opened to expose the opening 75 of the housing 71. The main-arm 35 proceeds from the opening 75 inside the cleaning unit 70 to transfer the wafer W to a position immediately above a lift plate 93 of the lifter 74.

In this state, the lifter 74 is actuated to raise the lift plate 93 to receive the wafer W from the wafer holder 35*a* of the main-arm 35 (step 3 (1)). Furthermore, the main-arm 35 draws in the wafer holder 35*a*, thereby the transfer in of the wafer W from the main-arm 35 to the cleaning unit 70 being over.

When transferring in the wafer W, the gate valve 76 is opened. However, the interior of the cleaning unit 70 is maintained lower in pressure than in the outside treatment space S. Accordingly, there is no chance that the air flows out of the cleaning unit 70 to the treatment space S to contaminate the treatment space S.

After the main-arm 35 retreats outside the cleaning unit 70, the lift plate 93 ascends further to hold the wafer W at a height between the upper and lower side members 103 and 104 of the edge remover 101 (step 3 (2)).

In this state, the edge remover 101 moves toward a radius direction of the wafer W to approach the periphery of the wafer W (step 3 (3)).

When the edge remover 101 approaches a position that sandwiches the periphery of the wafer W, the edge remover 101 stops. A cleaning fluid is ejected to the wafer W from piping embedded with an outwardly slanting direction in the lower side member 104. At the same time, piping embedded in the upper side member 103 sucks the cleaning fluid. When rotating the lifter 74 in this state, the cleaning fluid is supplied only to the periphery of the wafer W, thereby the so-called edge cleaning being implemented (step 3 (4)). FIG. 7 is a vertical section depicting schematically a situation of the edge cleaning.

When the edge cleaning is over, once the lifter 74 is stopped rotating. The edge remover 101 is moved outside in a radius direction of the wafer W to separate itself from the wafer W (step 3 (5)).

Next, the lifter 74 is lowered to the lowermost position to be accommodated in the spinning cup 73 (step 3 (6)). The wafer W disposed on the lifter 74, when lowering the lifter 74, is engaged with a step at the tip end of the upper opening 91 of the spinning cup 73 to be held (step 3 (7)).

However, as already shown in the small circle A of FIG. 6, before the spinning cup 73 is spun, a plurality of chuck members 92 disposed on the sidewall of the spinning cup 73 are approximately vertically directed. That is, the chuck members 92 do not press against the periphery of the wafer W, the wafer W held on the spinning cup 73 being simply put on. Accordingly, the wafer W can be lifted up with ease when the lifter 74 exerts an upward force in a vertical direction.

Next, while spinning the spinning cup 73 together with the wafer W, from a shower nozzle (not shown in the drawing) disposed above the wafer W, purified water is supplied on the wafer W to water cleanse the upper surface of the wafer W (step 3 (8)). At that time, as shown in the small circle B of FIG. 6, due to the rotation of the spinning cup 73, the upper portion of the chuck member 92 inclines inwardly, the tip end thereof pressing against the wafer W inwardly in a radius direction. As a result, the wafer W is solidly fixed in the spinning cup 73.

After the completion of the purified water cleaning of the upper surface of the wafer W, the shower nozzle stops ejecting the purified water. Thereafter, in the lifter 74 the cleaning fluid is supplied. The cleaning fluid is supplied from the inside of the lifter 74 through the through holes 93*a* on the upper surface of the lift plate 93 to the lower surface side of the wafer W. With the cleaning fluid, chemical cleaning is implemented on the lower surface side of the wafer W (step 3 (9)).

When the chemical cleaning of the lower surface of the wafer W is over, the cleaning fluid is stopped supplying to the lifter 74. In this state, the spinning cup 73 is rotated with a high rotational speed to throw off the cleaning fluid and moisture, thereby so-called spin-drying being implemented (step 3 (10)).

After the spin-drying is over, the spinning cup 73 is stopped rotating, the lifter 74 being raised to lift up the cleansed wafer W to the transfer position (I) (step 3 (11)).

During the above cleaning process, in the cleaning unit 70, the cleaning water or cleaning fluid is splashed. However, the interior of the cleaning unit 70 is always exhausted outside the plating system 1. Accordingly, the splashed cleaning water or cleaning fluid is exhausted together with the air outside the plating system 1. As a result, the interior of the cleaning unit 70 can be prevented from becoming full of the mist of the splashed cleaning water or cleaning fluid. Otherwise, the mist may diffuse into the treatment space S.

In this state, the gate valve 76 on the main-arm 35 side of the housing 71 is opened. After the gate valve 76 is opened to expose the opening 75, the main-arm 35 is effected to proceed in the cleaning unit 70. Furthermore, the wafer holder 35*a* of the main-arm 35 is extended up to the lower side of the lift plate 93 that has lifted up the wafer W. Thereafter, the lifter 74 is lowered to deliver the wafer W from the lift plate 93 to the main-arm 35 side. Subsequently, the main-arm 35 holding the wafer W is effected to retreat from the cleaning unit 70, thereby transferring out the wafer W (step 3 (12)).

(Detailed Explanation of Annealing Process)

After the cleaning by means of the cleaning unit 70 is over, as a subsequent treatment, for instance annealing as a third treatment is implemented. The annealing is implemented by disposing the wafer W on a so-called hot plate for a prescribed time period.

On the susceptor 120 of the heating unit as the third treatment unit such as shown in FIGS. 9 and 10, the wafer W is disposed for a prescribed time period to anneal.

When disposing the wafer W on the susceptor 120, the wafer holder 35*a* of the main-arm 35 holding the wafer W is extended immediately above the susceptor 120 before the lift pin 122 is raised. As a result, the wafer W is delivered from the main-arm 35 side to the heating unit side. In delivering the wafer W from the heating unit side to the main-arm 35 side, the opposite thereof is carried out.

When the annealing is over, once more the main-arm 35 receives the treated wafer W. The treated wafer W is, through the middle susceptor 36, or the cleaning unit 70, delivered from the main-arm 35 to the sub-arm 22.

The treated wafer W delivered to the sub-arm 22 is accommodated in the carrier cassette C. Thus, a series of treatment is over.

As explained above, in the plating system 1 involving the present embodiment, the process stations are disposed in multi-tiers to dispose a plurality of treatment units in a vertical direction in the treatment space. Accordingly, in a small occupation area, various kinds of treatments can be implemented, resulting in a high area efficiency of the plating system 1.

Furthermore, in the treatment space, each of the plating units M1 through M4 is accommodated in the closed housing 41 to maintain an isolated atmosphere by means of respectively independent airflow. As a result, between the plating units each, treatment atmospheres do not interfere with each other. Accordingly, a number of plating units can be disposed in a small treatment space, resulting in improvement of utility and efficiency of the area in the plating system 1.

Furthermore, since each plating unit is maintained in an isolated atmosphere, a plating unit that uses the plating solution bath accommodating a plating solution of different composition can be adjacently disposed. Accordingly, various plating can be implemented in a small space.

Furthermore, in each plating unit, the interior thereof is largely partitioned in two of upper and lower treatment portions. The first treatment portion A having the opening for transferring is disposed on the upper side, the second treatment portion B having the plating solution bath on the lower side.

A clean airflow is circulated to maintain a clean atmosphere in the treatment portion A. Thus, the wafer W is transferred in and out in the clean atmosphere. On the other hand, an environment where the plating solution tends to scatter is confined into the second treatment portion B on the lower side of the separator 42. In the second portion B, an airflow separate from that in the first treatment portion A, is circulated. Accordingly, there is no risk of contaminated particles or the like going from the first treatment portion A into the second treatment portion B to mingle.

(Modification Example of the First Embodiment)

The present invention is not restricted to the above embodiment. In the above embodiment, only one surface of the wafer W is plated. However, for instance, with a plurality of different liquid treatment baths and by turning upside down the wafer W, different liquid treatment can be applied between the front and back surfaces of the wafer W.

Still furthermore, to the above first treatment portion A, the filter removing only minute particles is disposed. However, a chemical filter may be further disposed to remove acids, organic substances and alkali ions.

Furthermore, in the neighborhood of the opening for transferring in and out of treatment units each, an air curtain due to a nitrogen gas may be further formed.

In addition, the air circulating in the first and second treatment portions A and B may be controlled in temperature and humidity thereof.

Furthermore, the main-arm 35 may be provided with a function capable of turning upside down the wafer W in the middle of transferring.

Still furthermore, in the above embodiment, for explanation, on the upper tier side of the treatment space S, other than the cleaning unit as the second treatment unit, the annealing unit is disposed as the third treatment device. However, as the third treatment unit, a treatment unit other than the annealing unit, for instance a pretreatment unit for surface treating the wafer W before the plating or a post-treatment unit for treating the plated wafer W may also be disposed.

Still furthermore, in the above embodiment, the wafer W is given as an example for explanation purposes. The present invention can also be applied as the plating system for a glass substrate for LCD.

Furthermore, in the above embodiment, the plating unit is disposed on the lower tier side. However, needless to say, any treatment unit capable of implementing treatment in liquid phase other than plating unit can be used.

(Second Embodiment)

In the following, a plating system involving a second embodiment of the present invention will be explained.

Of the plating system involving the present embodiment, the contents overlapping with the first embodiment will be omitted from explaining.

In the plating system involving the present embodiment, on the upper tier side of the treatment space, only the cleaning unit 70 is disposed. Furthermore, after the cleaning of the wafer W is over, the sub-arm 22 makes direct access into the cleaning unit 70 to transfer out the wafer W.

By configuring thus, the wafer W that has been cleansed to be clean, without going through the lower tier side of the treatment space S that tends to be contaminated with ease, is delivered to the sub-arm 22. As a result, when transferring out, there is no risk of contamination adhering on the treated wafer W.

(Third Embodiment)

Next, a method for manufacturing, by the use of the plating system 1 involving the present invention, a semiconductor device with no void in the plating layer will be explained.

On a surface of a wafer, there is formed minute unevenness. Accordingly, first a barrier metal layer is formed, thereon copper or the like being precipitated to form a conductor layer called a seed layer. By implementing electrolytic plating through the seed layer, a plating layer that is an interconnection layer is made of copper.

However, when trying to plate on the seed layer to form a thick layer at a time, in plating on the seed layer to form a copper layer, sometimes there may be formed holes called void or seam in the plating layer. When the holes are formed in the plating layer, there is likelihood of occurrence of disconnection in an interconnection layer or lowering of quality and yield of the semiconductor devices due to variation of electrical resistance.

Accordingly, it is strongly demanded to provide a method for manufacturing a semiconductor device that does not contain holes in the plating layer.

Furthermore, properties of the conductor layer formed on the seed layer are intimately related with a crystallographic direction of the copper layer constituting the conductor layer, the crystallographic direction of the copper layer being necessary to be aligned in a definite direction.

However, the crystallographic direction of the plating layer is dependent on a structure of the seed layer thereunder. Accordingly, it is difficult to align the crystallographic direction in the plating layer alone.

Accordingly, it is strongly demanded to provide a manufacturing method of a semiconductor device that is provided with a conductor layer of which crystallographic direction is aligned in a prescribed direction.

FIG. 25 is a flow chart showing a flow of a manufacturing process of a semiconductor device involving the present embodiment, FIGS. 26A through D being vertical sections showing schematically a situation when the semiconductor device is manufactured. In the following, with reference to FIGS. 25 and 26, the respective steps of the manufacturing method of the semiconductor device involving the present embodiment will be explained.

The sub-arm 22 makes access into the carrier cassette C disposed on the susceptor 21 to take out an untreated wafer W and deliver to the main-arm 35. The main-arm 35 delivers the wafer W to the holder 49 in the plating unit M1, thereby the transfer of the wafer W being over (step 4 (1)).

Figure 26A:
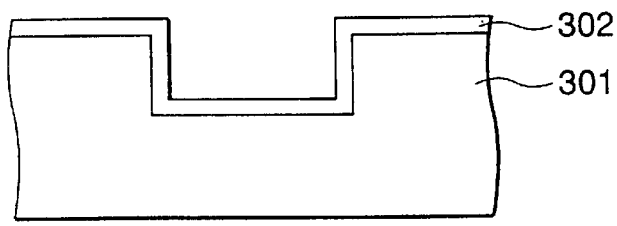
FIGS. 26A through 26D are vertical sections showing a semiconductor device in a manufacturing method of a semiconductor device according to an embodiment of the present invention.

In the wafer W being transferred into the plating unit M1, as shown in FIG. 26A, on a surface of a wafer W 301 thereon a groove is formed a barrier metal layer not shown in the drawing is formed. Thereon, a seed layer 302 consisting of a thin copper layer is formed by means of PVD or CVD.

Subsequently, in the plating unit M1, a first plating is implemented (step 4 (2)).

In the first plating that is implemented in this step, when putting a total depth of a contact hole and a total height of a plating layer formed on the seed layer, h and H, respectively, it is preferable for a thickness D of a plating layer formed in the first plating to be (½)H≦D<H. The first plating is preferable to be implemented by sending a relatively small electric current, for instance, approximately 0.5 ASD (Ampere per Square Decimeter). It is because mild formation of the plating layer can prevent holes such as voids or seams from forming.

Figure 26B:
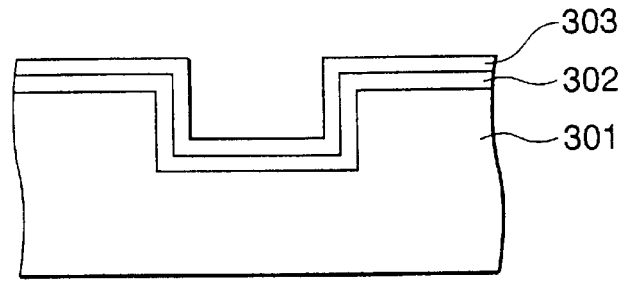

When the first plating is over thus, as shown in FIG. 26B, a first plating layer 303 is formed.

When the first plating is over, the main-arm 35 makes access into the plating unit M1 to take out the treated wafer W, followed by transferring to an annealing unit (step 4 (3)).

When the transfer to the annealing unit is over, in the annealing unit, a first annealing is implemented (step 4 (4)).

As a result of the first annealing, the crystallographic direction of the plating layer 303 is aligned.

After the first annealing is over, once more through the main-arm 35, the treated wafer W is again transferred in the plating unit M1 (step 4 (5)).

Figure 26C:
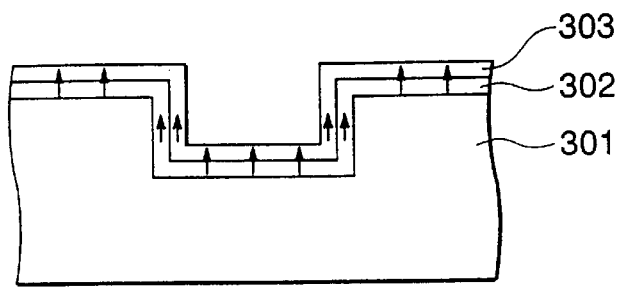
Figure 26D:
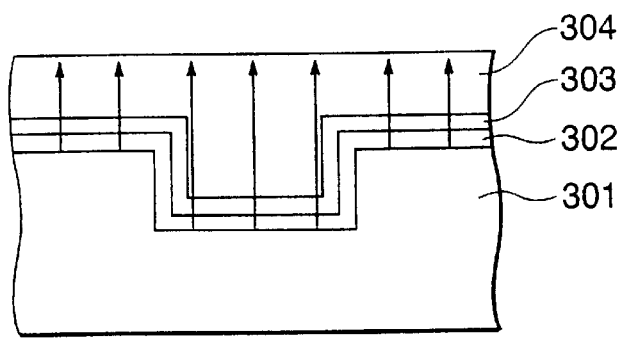

After the wafer W is once more set in the plating unit M1, a second plating is carried out (step 4 (6)), as shown in FIG. 26C, on the plating layer 303, a new plating layer 304 being further formed.

At that time, in the plating layer 303 under the plating layer 304, due to the first annealing the crystallographic direction thereof is aligned. Accordingly, the plating layer 304 is liable to be aligned in its crystallographic direction with that of the plating layer 303.

Accordingly, the second plating even under the condition of a relatively large electric current, for instance approximately 2.0 ASD, forms the holes with difficulty. Since the second plating can be implemented thus by sending a relatively large electric current, plating speed is heightened to form a thicker plating layer in a short time. In the second plating, the plating layer 304 is further formed on the first plating layer 303 to be a plating layer of a total thickness H on the seed layer.

After the second plating is over, once more the wafer W is transferred into the annealing unit by means of the main-arm 35 (step 4 (7)), here the second annealing being implemented (step 4 (8))

Due to the second annealing, an internal state of the plating layer 304 is more stabilized.

After the second annealing is over, the wafer W is transferred out of the annealing unit by means of the main-arm 35 (step 4 (9)), thus a series of treatment being over.

Thus, in the manufacturing method of a semiconductor device involving the present embodiment, after the formation of the first plating layer, the step of annealing is implemented to align the crystallographic direction of the first plating layer, thereafter the second plating being implemented.

Accordingly, the second plating layer is formed in accordance with the crystallographic direction aligned in the first plating layer. In addition, since the second plating layer is formed in accordance with the crystallographic direction of the first plating layer, in the second plating layer, the holes are generated with more difficulty than in the first plating layer. Furthermore, due to the use of larger electric current, the second plating layer can be formed with a growth rate larger than that of the first plating layer.

Still furthermore, by annealing after the formation of the second plating layer, an internal structure of the second plating layer can be stabilized to result in an improvement of quality of the plating layer.

(Fourth Embodiment)

In the present embodiment, after the formation of the seed layer, the seed layer is annealed to align the crystallographic direction thereof in a prescribed direction, thereafter on the seed layer the plating being implemented to form a plating layer.

Figure 28A:
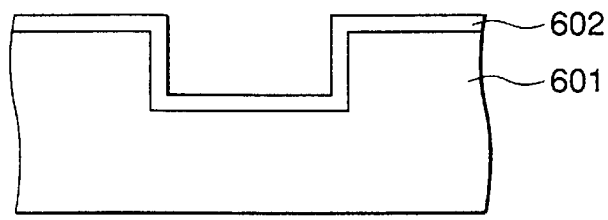
FIGS. 28A through 28C are vertical sections showing a semiconductor device in a manufacturing method of a semiconductor device according to another embodiment of the present invention.
Figure 28B:
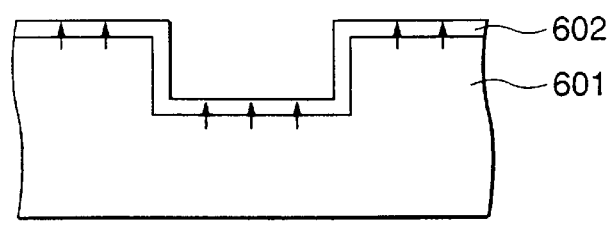
Figure 28C:
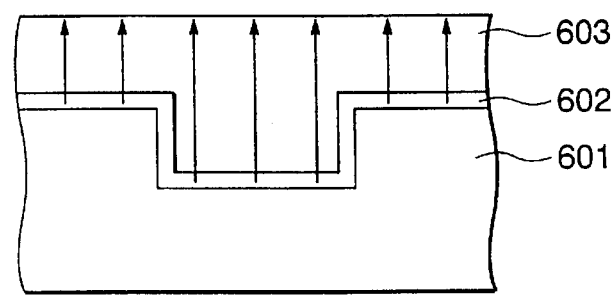

FIG. 27 is a flow chart showing a manufacturing process of a semiconductor device involving the present embodiment, FIGS. 28A through C being vertical sections showing a situation where the semiconductor device involving the present embodiment is manufactured.

In the method involving the present embodiment, after a seed layer 602 is formed on a wafer thereon a barrier metal layer is formed (step 5 (1), FIG. 28A), the wafer W is transferred in the annealing unit (step 5 (2)) to anneal, thereby aligning the crystallographic direction of the seed layer 602 (step 5 (3), FIG. 28B).

Thereafter, the wafer W is transferred in the plating unit M1 (step 5 (4)), a plating layer 603 being further formed on the seed layer 602 of which crystallographic direction is aligned (step 5 (5), FIG. 28C).

At that time, in the seed layer 602, as shown in FIG. 28B, due to the annealing, the crystallographic direction thereof is aligned, that is, directed in a prescribed direction.

Accordingly, the plating layer 603 newly formed in the step of plating is formed so that the crystallographic direction thereof is aligned with that of the seed layer 602.

The plating layer may be further annealed. In that case, there is obtained an effect that the crystallographic direction is aligned more easily.

What is claimed is:

1. A liquid treatment system, comprising:

a plating unit constructed and arranged to plate a substrate with a plating solution containing a metal ion;

a cleaning unit constructed and arranged to clean the plated substrate, said cleaning unit being disposed above the plating unit;

a first gas feed constructed and arranged to feed a cleansed gas flowing from the cleaning unit to the plating unit in the liquid treatment system; and a first transfer unit constructed and arranged to transfer the substrate in a vertical direction between the plating unit and the cleaning unit.

2. The liquid treatment system as set forth in claim 1, wherein the first transfer unit comprises a mechanism constructed and arranged to turn upside down front and back surfaces of the substrate.

3. The liquid treatment system as set forth in claim 1, further comprising:

a second transfer unit constructed and arranged to transfer the substrate out of the cleaning unit.

4. The liquid treatment system as set forth in claim 1, further comprising:

a liquid treatment unit constructed and arranged to implement liquid treatment on the substrate, before or after plating the substrate at the plating unit.

5. The liquid treatment system as set forth in claim 1, further comprising:
   a heating unit constructed and arranged to heat the plated substrate.

6. The liquid treatment system as set forth in claim 1, further comprising:
   a temperature controller constructed and arranged to control a temperature in the liquid treatment system.

7. The liquid treatment system as set forth in claim 1, wherein the plating unit and the cleaning unit are independent from each other and detachable from the liquid treatment system.

8. The liquid treatment system as set forth in claim 1, wherein the plating unit has a housing capable of maintaining an interior atmosphere thereof substantially airtight.

9. The liquid treatment system as set forth in claim 8, wherein the plating unit further comprises a second gas feed constructed and arranged to feed a cleansed gas in the housing.

10. The liquid treatment system as set forth in claim 8, wherein the plating unit further comprises an exhaust system constructed and arranged to make a pressure of the housing interior lower than that of the housing exterior.

11. The liquid treatment system as set forth in claim 8, wherein the plating unit further comprises a temperature controller constructed and arranged to control a temperature in the housing.

\* \* \* \* \*